United States Patent
Togawa et al.

(10) Patent No.: US 11,698,360 B2
(45) Date of Patent: Jul. 11, 2023

(54) CHIRALITY DETECTION DEVICE, CHIRALITY DETECTION METHOD, SEPARATION DEVICE, SEPARATION METHOD, AND CHIRAL SUBSTANCE DEVICE

(71) Applicants: University Public Corporation Osaka, Osaka (JP); Inter-University Research Institute Corporation National Institutes of Natural Sciences, Mitaka (JP)

(72) Inventors: Yoshihiko Togawa, Sakai (JP); Hiroaki Shishido, Sakai (JP); Hiroshi Yamamoto, Okazaki (JP)

(73) Assignees: UNIVERSITY PUBLIC CORPORATION OSAKA, Osaka (JP); INTER-UNIVERSITY RESEARCH INSTITUTE CORPORATION NATIONAL INSTITUTES OF NATURAL SCIENCES, Tokyo (JP)

( * ) Notice: Subject to any disclaimer, the term of this patent is extended or adjusted under 35 U.S.C. 154(b) by 45 days.

(21) Appl. No.: 17/611,347

(22) PCT Filed: May 15, 2020

(86) PCT No.: PCT/JP2020/019479
§ 371 (c)(1),
(2) Date: Nov. 15, 2021

(87) PCT Pub. No.: WO2020/230893
PCT Pub. Date: Nov. 19, 2020

(65) Prior Publication Data
US 2022/0214308 A1    Jul. 7, 2022

(30) Foreign Application Priority Data
May 16, 2019 (JP) ................................ 2019-092958

(51) Int. Cl.
*G01N 27/72* (2006.01)
*G01R 33/12* (2006.01)

(52) U.S. Cl.
CPC ......... *G01N 27/72* (2013.01); *G01R 33/1284* (2013.01)

(58) Field of Classification Search
CPC .... G01N 27/72; G01N 27/025; G01N 27/007; G01N 27/84; G01R 33/1284;
(Continued)

(56) References Cited

U.S. PATENT DOCUMENTS 7,466,523 B1 * 12/2008 Chen .................... G11B 5/3906
365/158
11,237,230 B1 * 2/2022 Iwasaki ................ A61B 5/6803
(Continued)

FOREIGN PATENT DOCUMENTS

| JP | 2005-181071 A | 7/2005 |
| JP | 2005-526607 A | 9/2005 |

(Continued)

OTHER PUBLICATIONS

Santra, Kakali, et al. "Electric-field-enhanced adsorption of chiral molecules on ferromagnetic substrates." The Journal of Physical Chemistry B 123.44 (2019): 9443-9448. (Year: 2019).*

(Continued)

*Primary Examiner* — Christopher P McAndrew
(74) *Attorney, Agent, or Firm* — Stites & Harbison, PLLC; Jeffrey A. Haeberlin

(57) ABSTRACT

A chirality detector of the present invention for detecting chirality of chiral material, includes: a first electrode and a second electrode that are configured to apply a voltage to a subject containing the chiral material; a spin detection layer configured to be in contact with the subject; a power supply; and a control section. The power supply and the control
(Continued)

section are configured to generate an electric field at the subject by applying the voltage between the first electrode and the second electrode. The control section is configured to detect a voltage generated in the spin detection layer in a direction that goes across a direction of the electric field or a voltage generated between the spin detection layer and the subject, and also is configured to detect chirality of the chiral material on the basis of the detected voltage.

4 Claims, 12 Drawing Sheets

(58) Field of Classification Search
CPC ............ G01R 33/0017; G01R 33/0052; G01R 33/093; H01L 43/10
USPC ........................................................ 324/240
See application file for complete search history.

(56) References Cited

U.S. PATENT DOCUMENTS

| | | |
|---|---|---|
| 2005/0136195 A1 | 6/2005 | Raval |
| 2010/0256354 A1 | 10/2010 | Ishihara et al. |
| 2014/0099238 A1 | 4/2014 | Huang |
| 2015/0049542 A1 | 2/2015 | Naaman et al. |
| 2016/0057859 A1* | 2/2016 | de Miguel .......... H01L 29/0665 174/258 |
| 2017/0226027 A1 | 8/2017 | Hermans et al. |
| 2019/0146042 A1* | 5/2019 | Israelowitz ........ G01R 33/1269 324/252 |

FOREIGN PATENT DOCUMENTS

| | | |
|---|---|---|
| JP | 2010-527284 A | 8/2010 |
| JP | 2015-031605 A | 2/2015 |
| JP | 2015-512159 A | 4/2015 |
| JP | 2017-529323 A | 10/2017 |
| JP | 2018-013351 A | 1/2018 |
| WO | 2008/130980 A2 | 10/2008 |
| WO | 2009/075359 A1 | 6/2009 |
| WO | WO-2017221250 A1 * | 12/2017 |

OTHER PUBLICATIONS

Ikegami, Hiroki, Yasumasa Tsutsumi, and Kimitoshi Kono. "Observation of intrinsic Magnus force and direct detection of chirality in superfluid 3He-A." Journal of the Physical Society of Japan 84.4 (2015): 044602. (Year: 2015).*

Kimura, T., et al. "Room-Temperature Reversible Spin Hall Effect," Physical Review Letters 98, 156601 (2007).

Jedema, F.J., et al. "Electrical detection of spin precession in a metallic mesoscopic spin valve," Nature, vol. 416, pp. 713-716 (2002).

Fontanesi, C., et al. "Spin-Dependent Processes Measured without a Permanent Magnet," Advanced Materials 30, 1707390 (2018).

Abendroth, J.M., et al. "Spin Selectivity in Photoinduced Charge-Transfer Mediated by Chiral Molecules," ACS Nano, vol. 13, No. 5, pp. 4928-4946 (2019).

* cited by examiner

[FIG. 1]
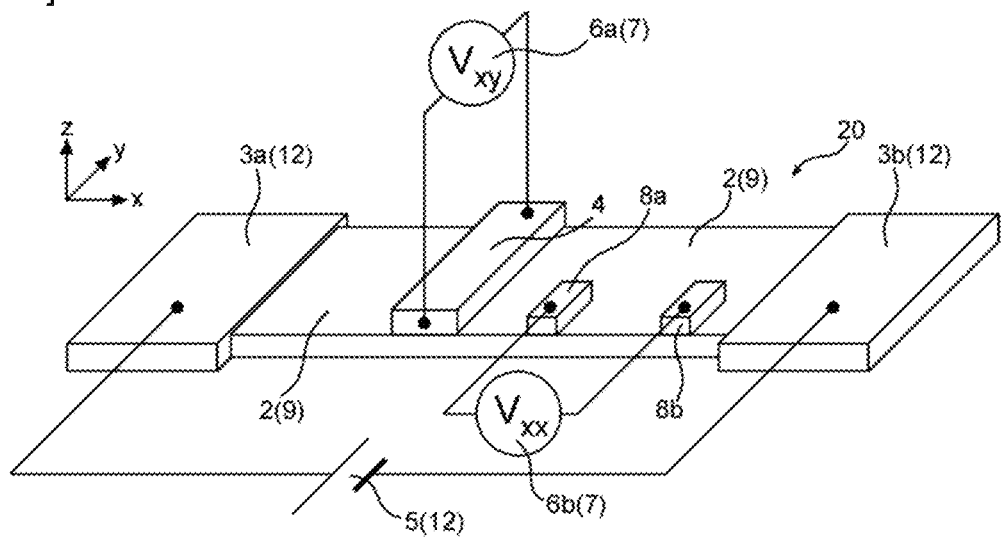
[FIG. 2]
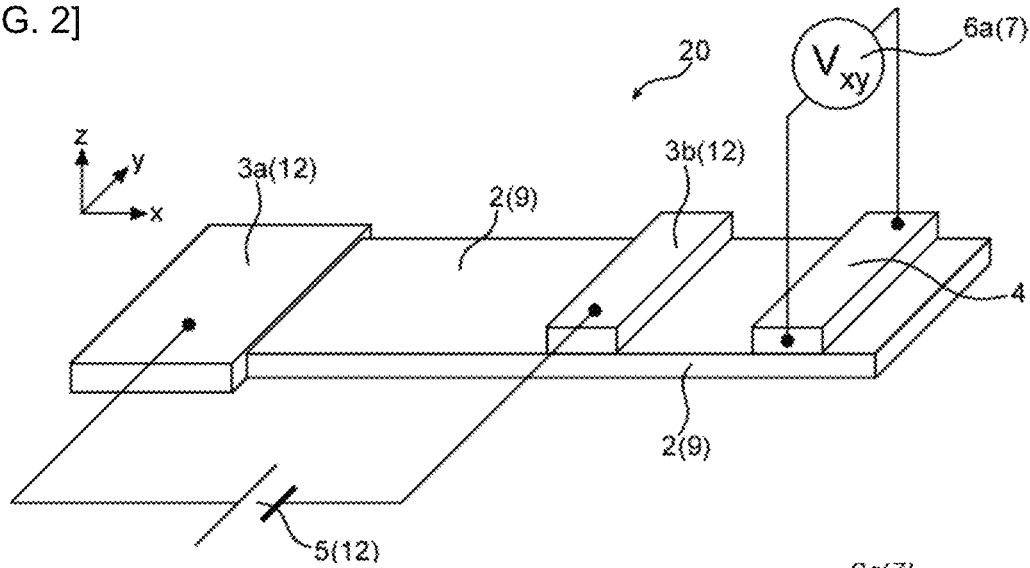
[FIG. 3]
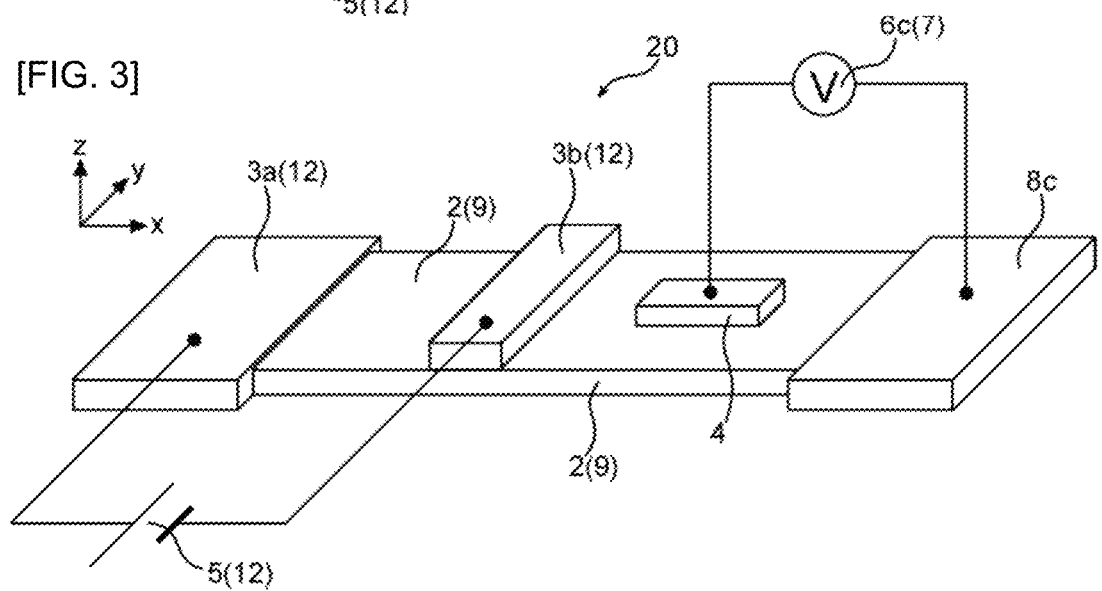

[FIG. 4]
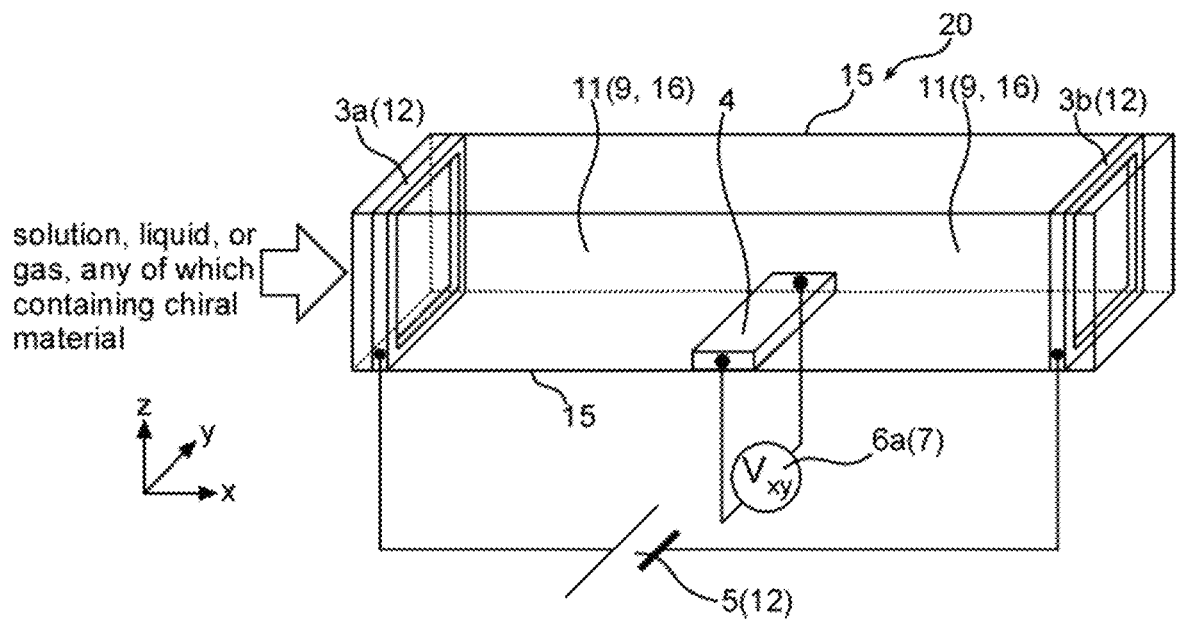
[FIG. 5]
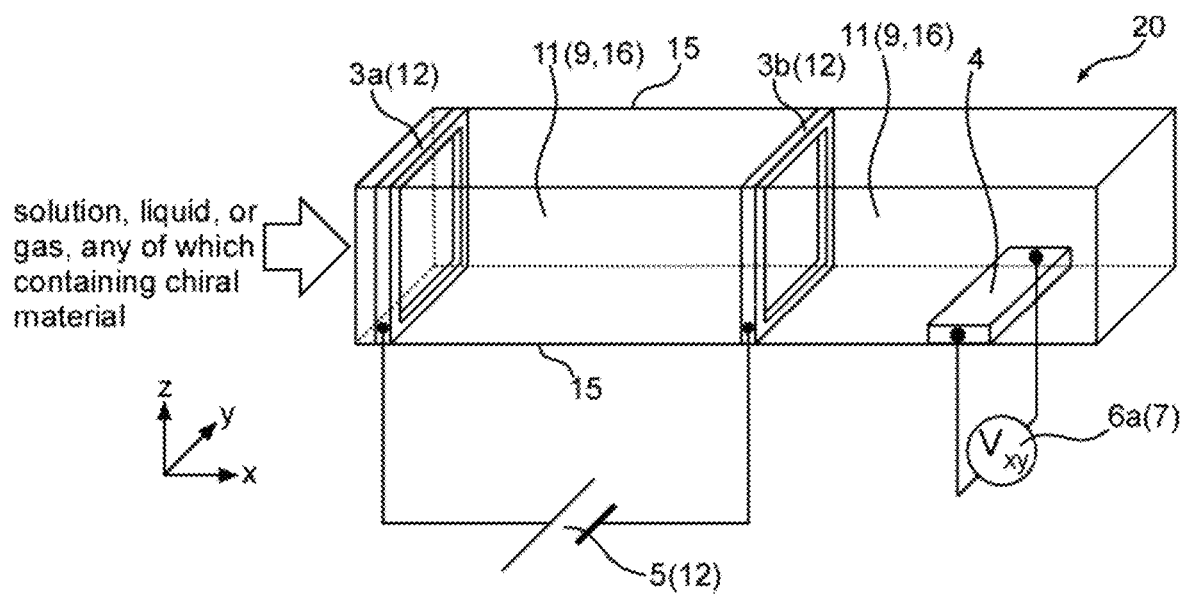

[FIG. 6]
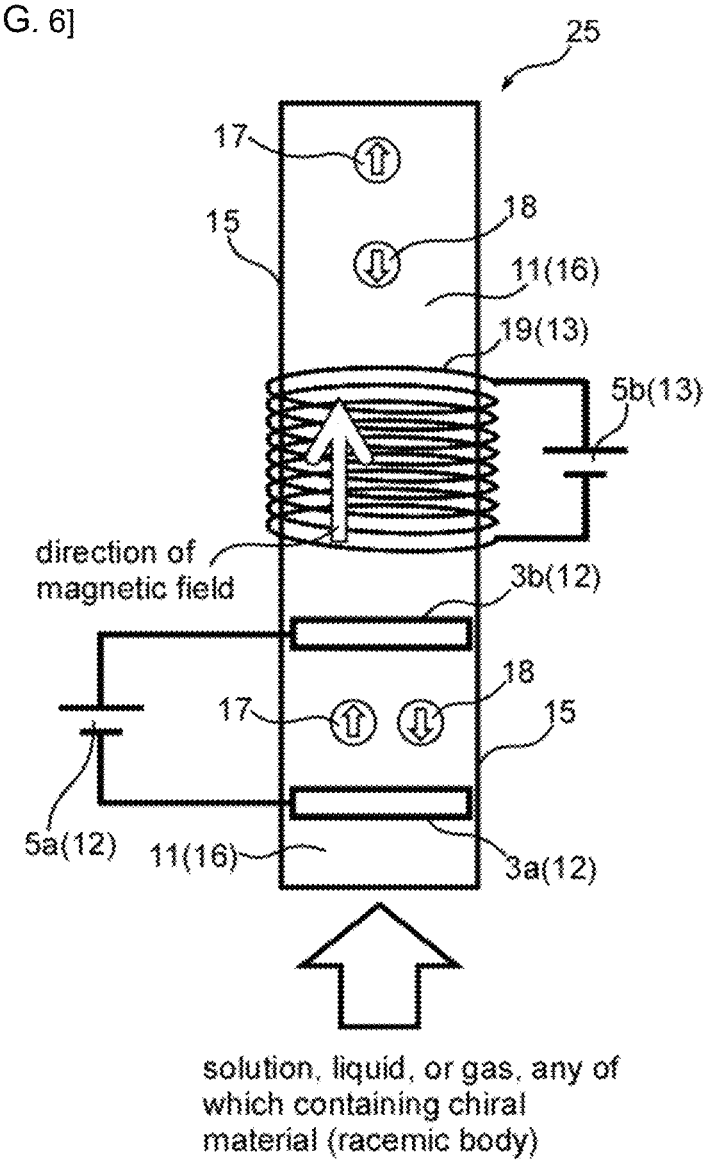

[FIG. 7]
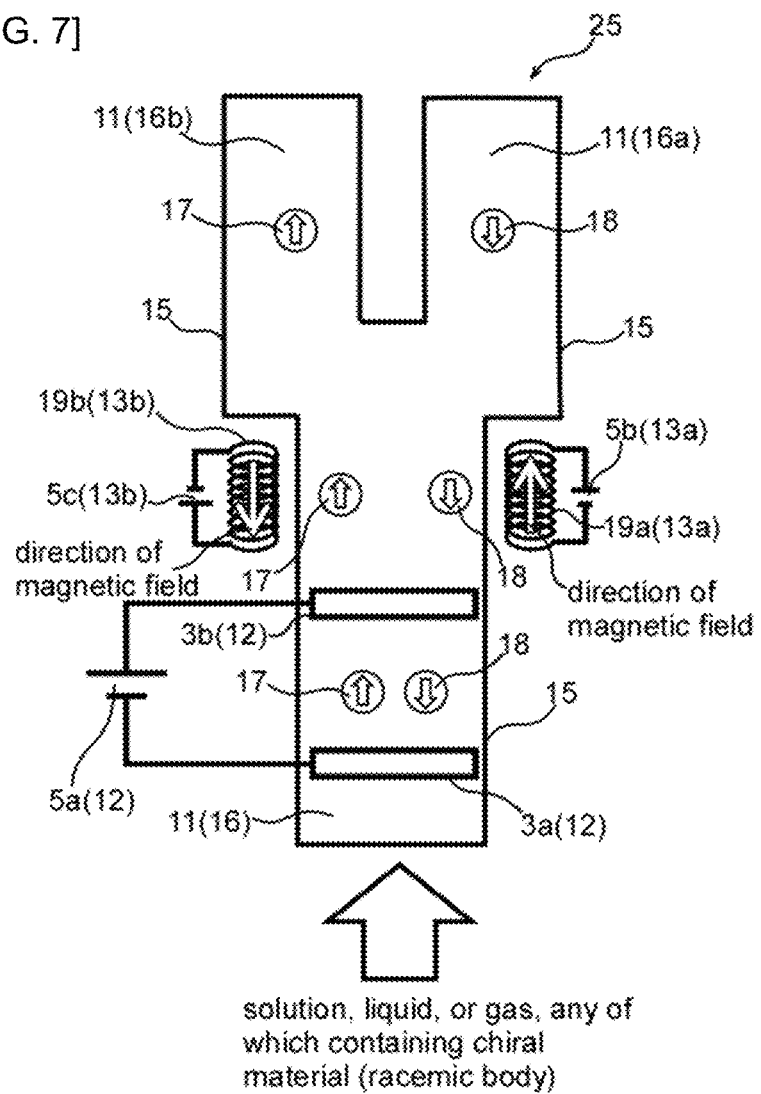
[FIG. 8]
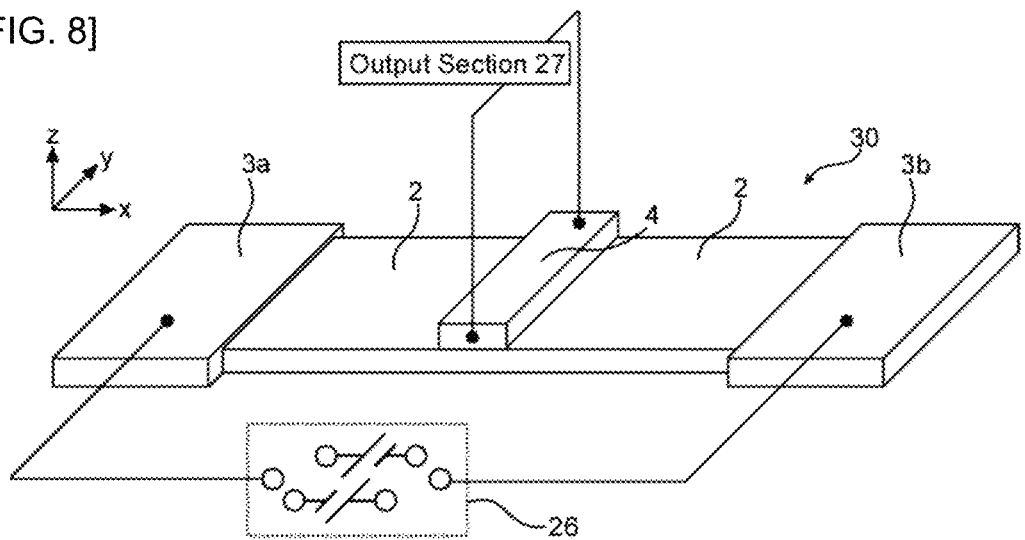

[FIG. 9]
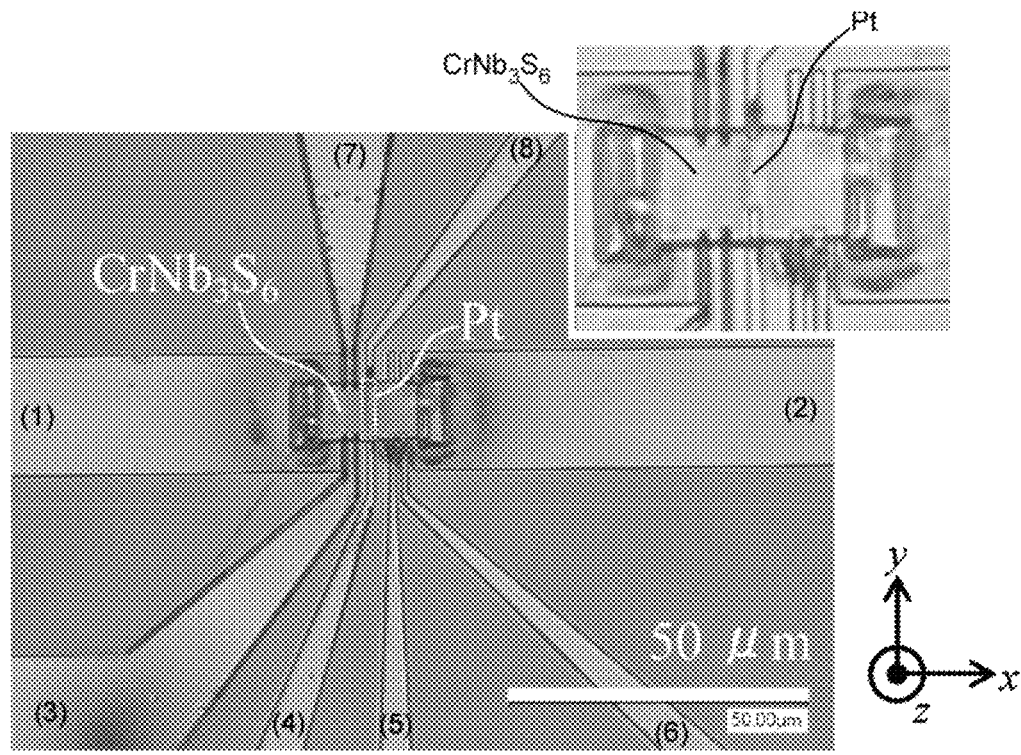
[FIG. 10]
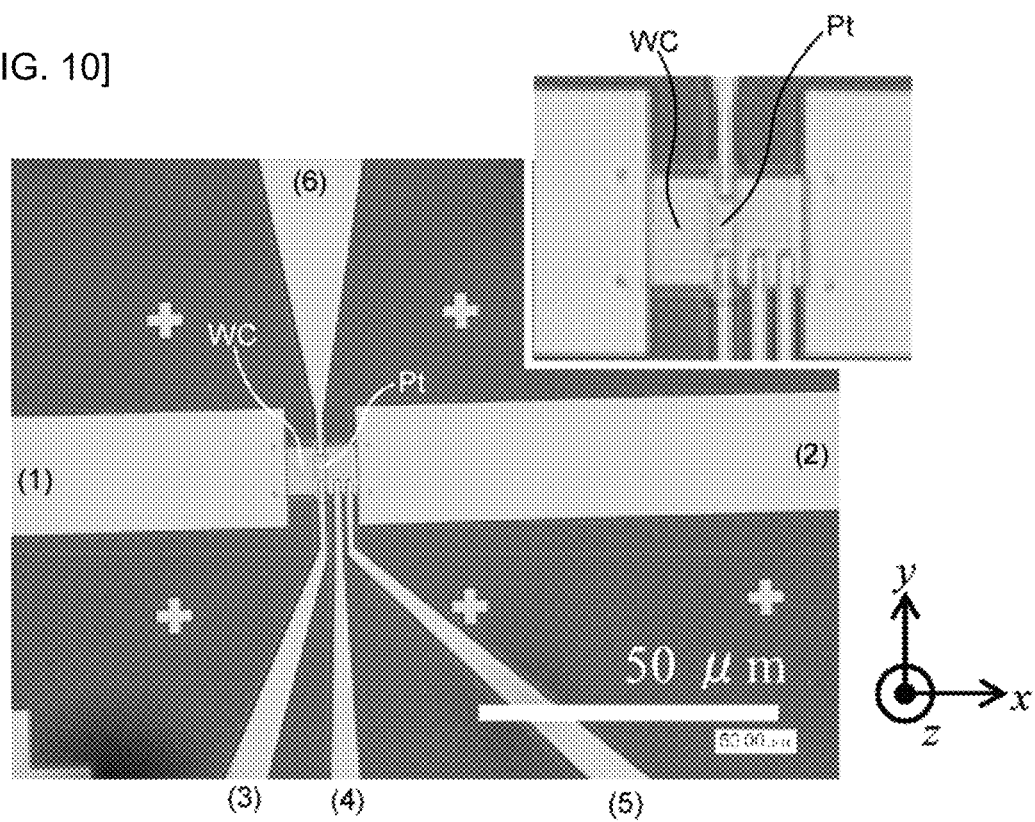

[FIG. 11]
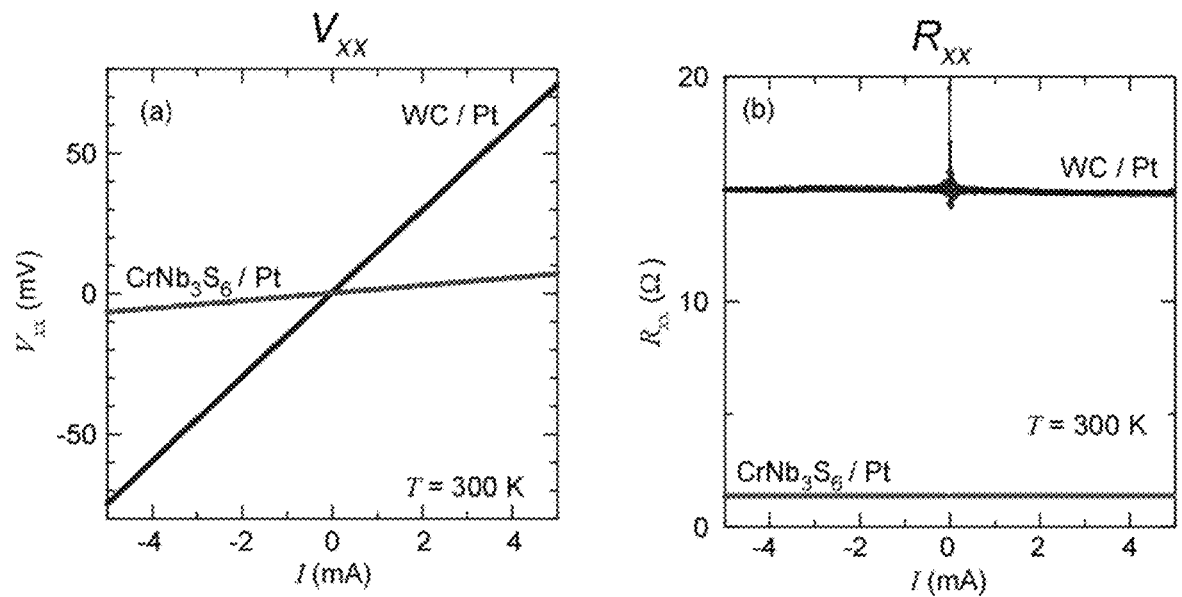
[FIG. 12]
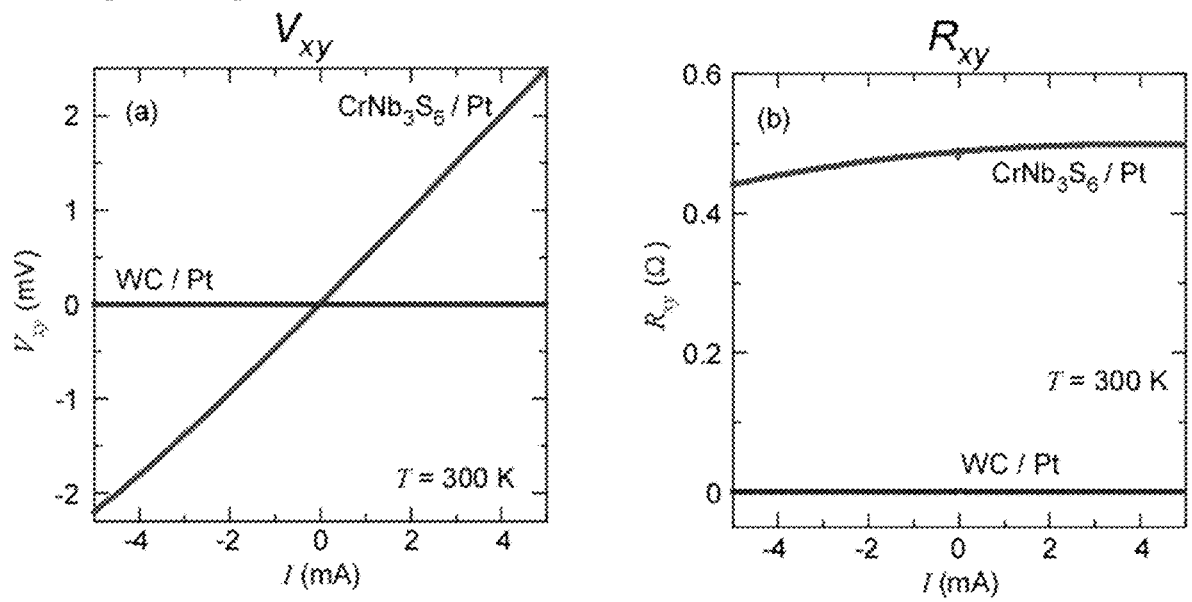

[FIG. 13]
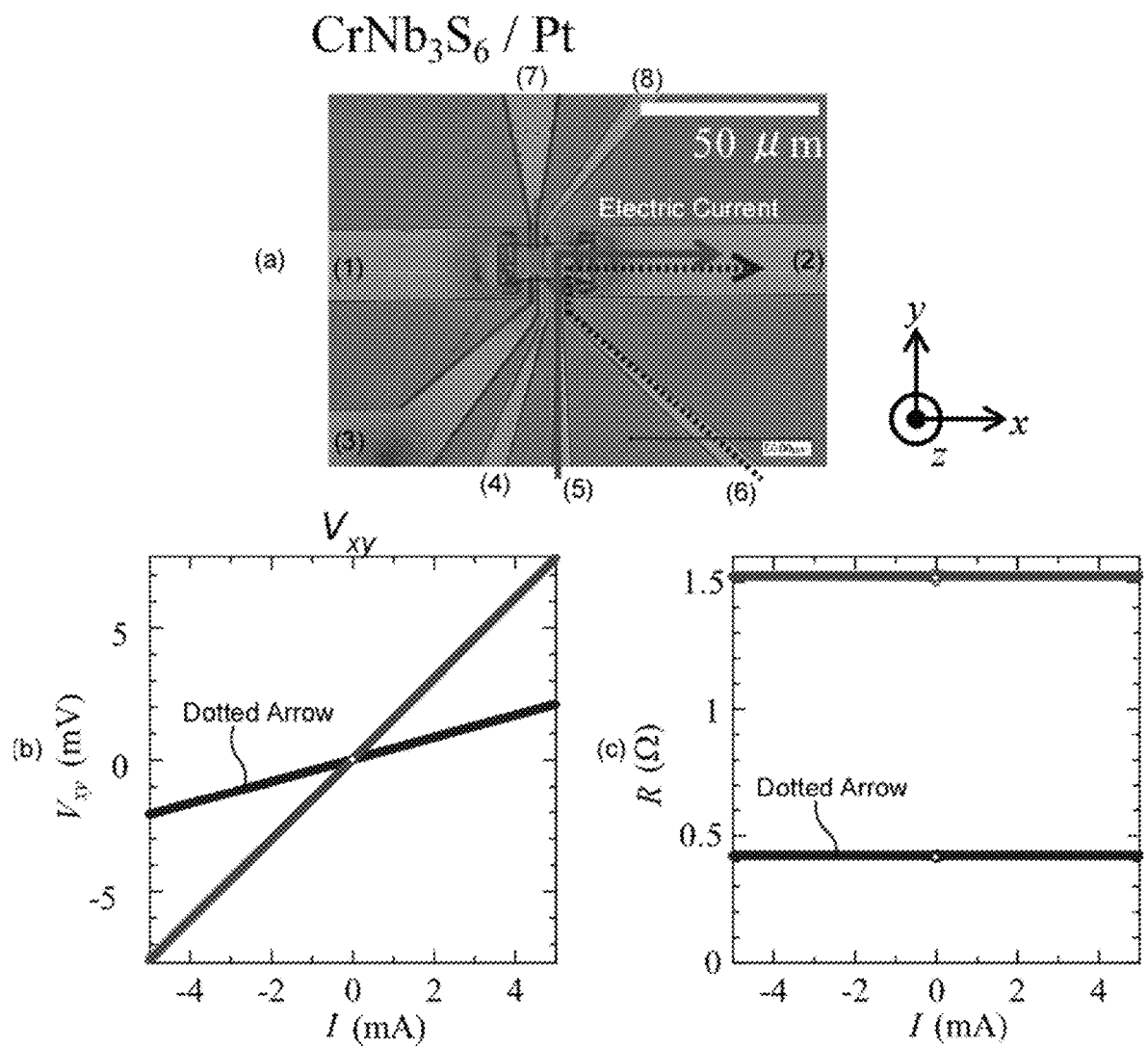

[FIG. 14]
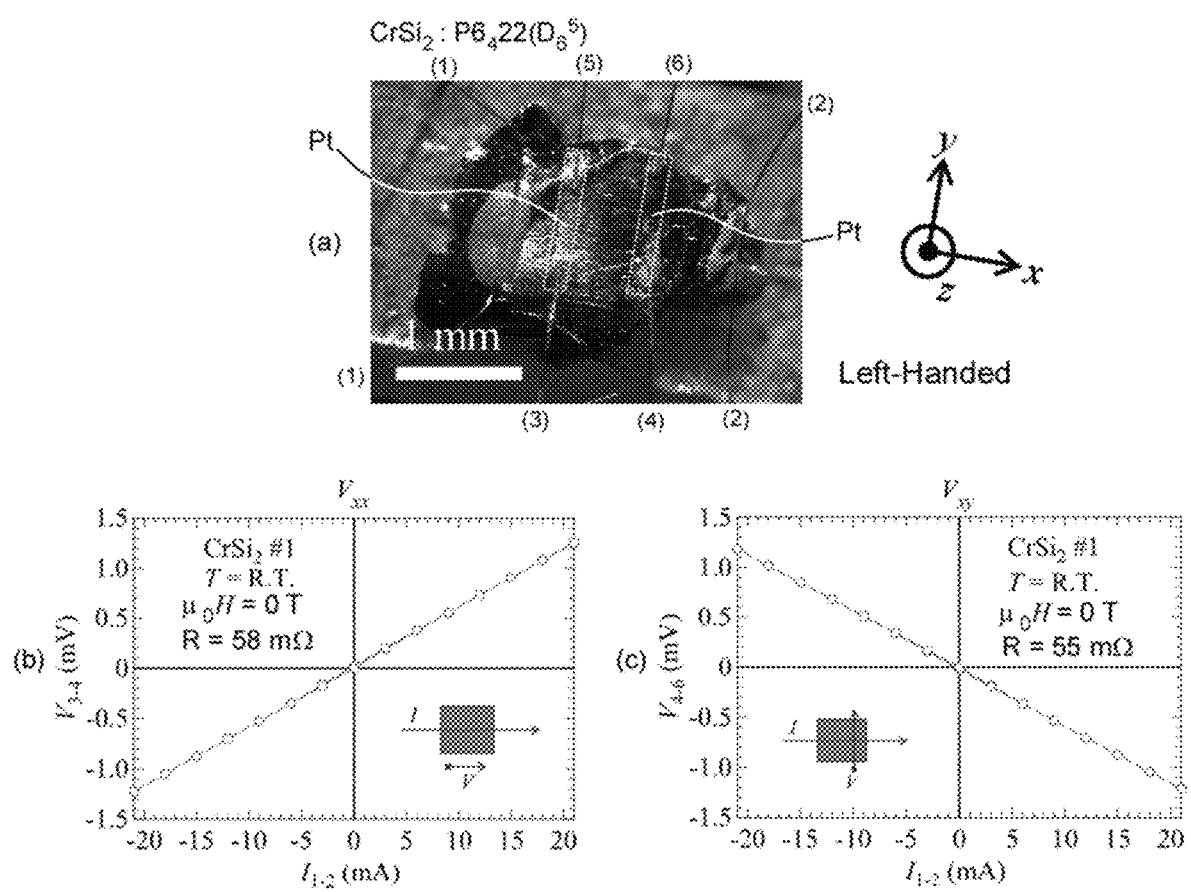

[FIG. 15]
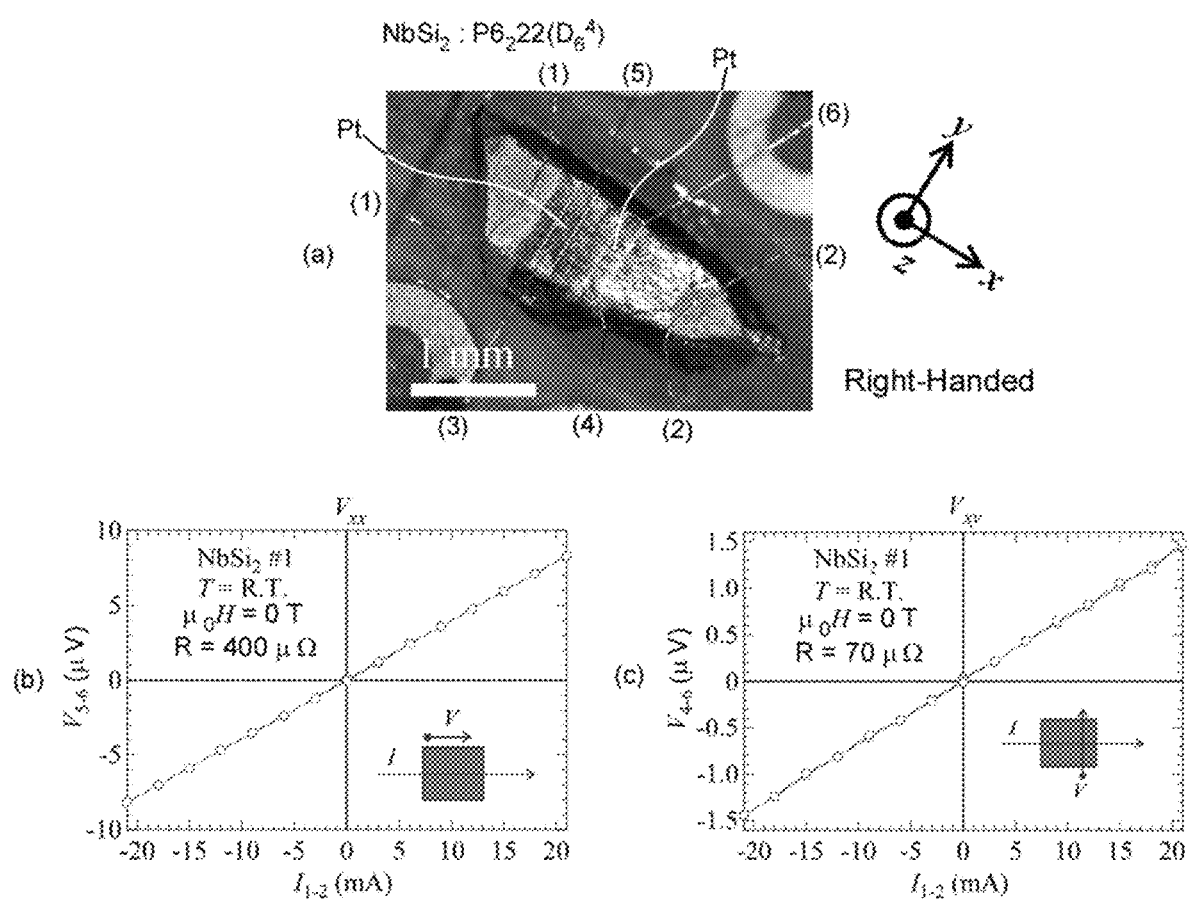

[FIG. 16]
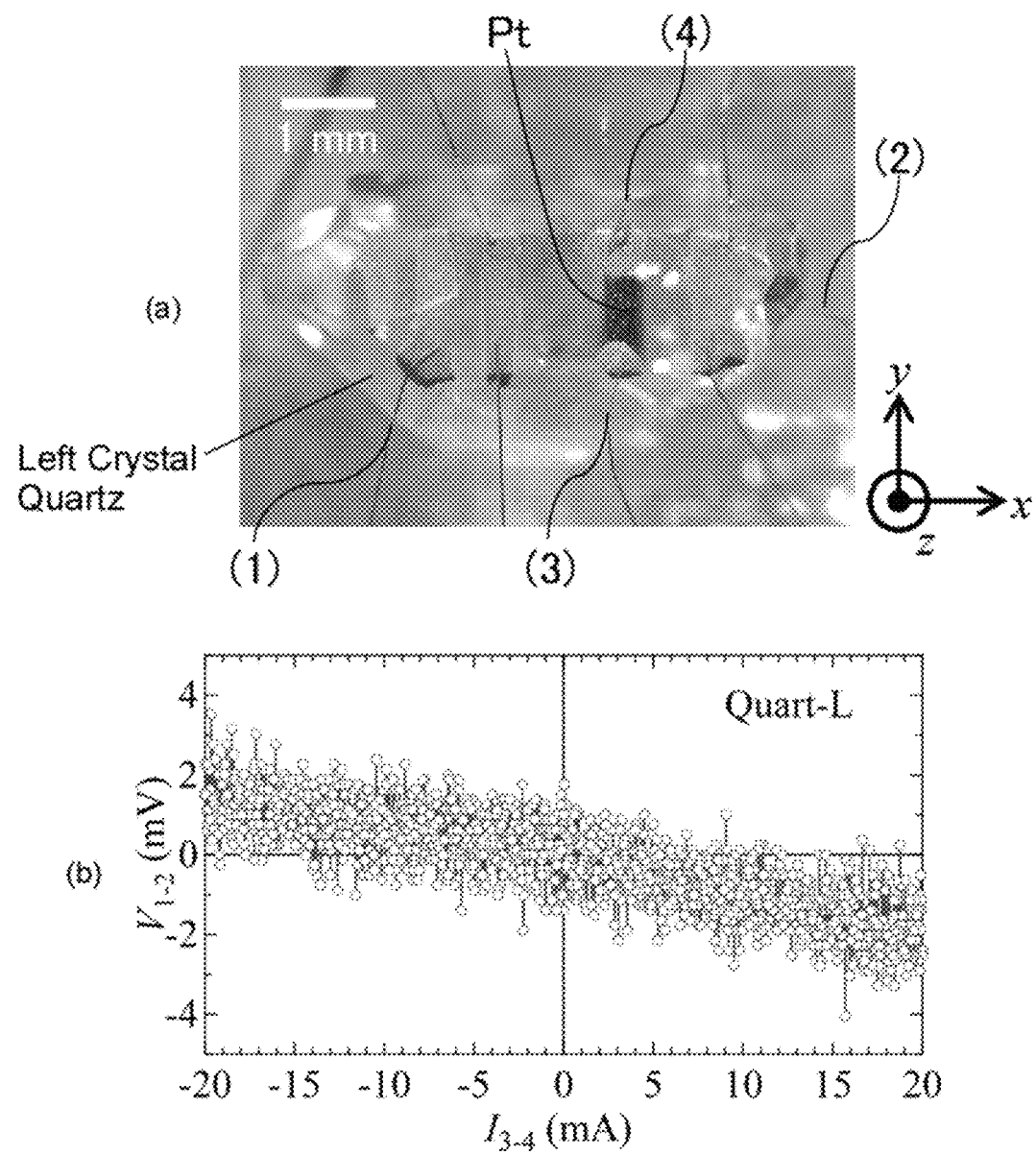

[FIG. 17]
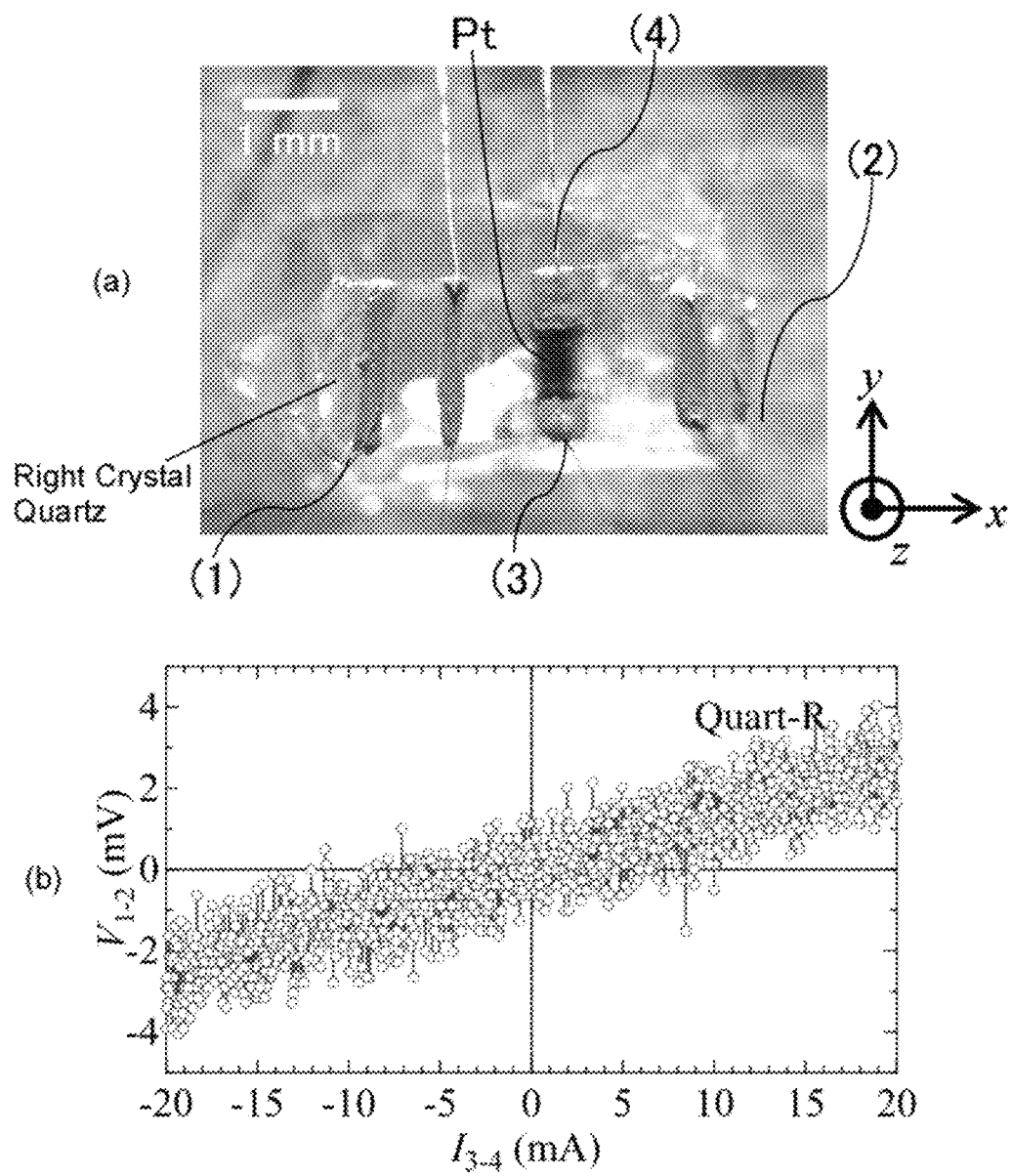

[FIG. 18]
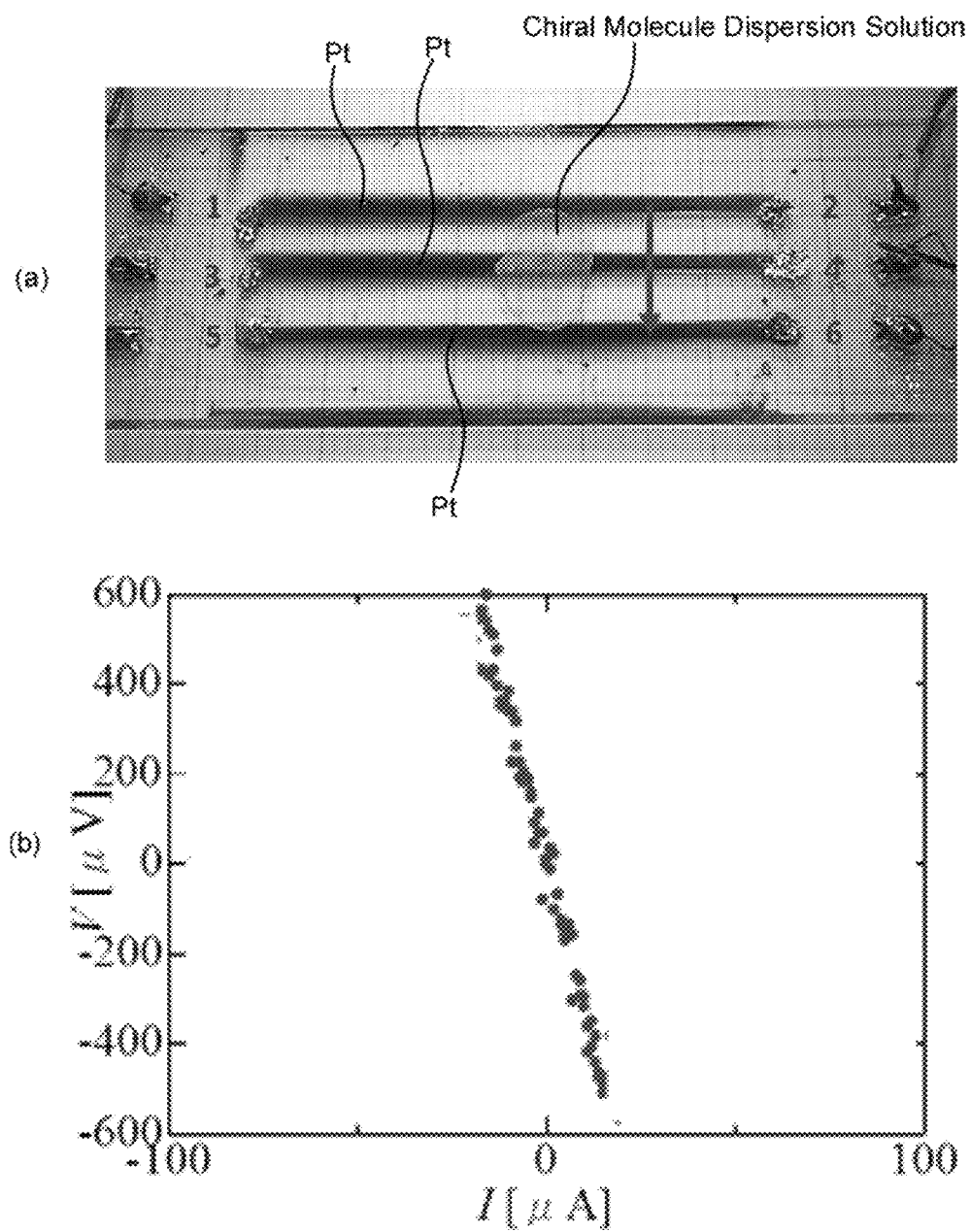

CHIRALITY DETECTION DEVICE, CHIRALITY DETECTION METHOD, SEPARATION DEVICE, SEPARATION METHOD, AND CHIRAL SUBSTANCE DEVICE

TECHNICAL FIELD OF THE INVENTION

The present invention relates to a chirality detector, a chirality detection method, a separator, a separation method, and a chiral material device.

BACKGROUND OF THE INVENTION

Substances with a molecular structure that has chirality and substances with a crystal structure that has chirality (hereinafter collectively referred to as chiral material) are known. For example, lactic acid $C_3H_6O_3$ has a molecular structure with chirality; and there are D-lactic acid and L-lactic acid, which are related as object and mirror image. Quartz (crystal of $SiO_2$) also has a crystal structure with chirality. Quartz has a crystal structure in which $SiO_4$ tetrahedra share their respective vertexes. If looking at the arrangement of the connected $SiO_4$ tetrahedra, the $SiO_4$ tetrahedra form spirals with respect to a direction of crystal elongation (c-axis), and there are crystals in which the spiral is right-handed (right crystal quartz) and crystals in which the spiral is left-handed (left crystal quartz). The crystal structure of the right crystal quartz and that of the left crystal quartz are related as object and mirror image.

Properties of chiral material may differ between right-handed and left-handed forms, and methods for detecting chirality of the chiral material are known (see, for example, PTL 1 and PTL 2).

Molecular chiral material has been known to generate spin-polarized electrons by a chirality inductive spin selectivity (CISS) effect (see, for example, PTL 3). It has been also known that when spin polarization of a ferromagnetic body is absorbed by spin absorbing material, an electric charge flow occurs in a direction orthogonal to a spin polarization direction and to a spin propagating direction (inverse spin Hall effect) (see, for example, NPL 1). Also, nonlocal spin valve that can detect spin propagation has been known (see, for example, NPL 2).

CROSS REFERENCES

Patent Literature Documents

PTL 1: Japanese Unexamined Patent Application Publication No. 2018-13351
PTL 2: Japanese Unexamined Patent Application Publication No. 2015-31605
PTL 3: National Publication of Japanese Translation of PCT Application No. 2015-512159

Non-Patent Literature Documents

NPL 1: T. Kimura, et al. *Phys. Rev. Lett.* 98. 156601 (2007)
NPL 2: F. J. Jedema, et al. *Nature.* 416. 713 (2002)

SUMMARY OF THE INVENTION

Object of the Invention

In the conventional chirality detection methods, subjects are limited to chiral substances contained in solutions or gaseous substances; and solid substances are difficult to detect chirality thereof.

The present invention was devised in view of such circumstances, and provides a chirality detector that is capable of detecting chirality of chiral material in various states.

Solution to Problem

The present invention provides a chirality detector for detecting chirality of chiral material, comprising: a first electrode and a second electrode that are configured to apply a voltage to a subject containing the chiral material; a spin detection layer configured to be in contact with the subject; a power supply; and a control section, wherein the power supply and the control section are configured to generate an electric field at the subject by applying the voltage between the first electrode and the second electrode; and the control section is configured to detect a voltage generated in the spin detection layer in a direction that goes across a direction of the electric field or a voltage generated between the spin detection layer and the subject, and also is configured to detect chirality of the chiral material on the basis of the detected voltage.

Advantageous Effect of the Invention

The power supply and the control section are configured to generate the electric field at the subject containing the chiral material by applying the voltage between the first electrode and the second electrode. When the electric field is generated in this way, spin-polarized electrons can be generated in the chiral material by a chirality inductive spin selectivity (CISS) effect.

The CISS effect is an effect that electrons are spin-polarized when the electrons pass through a chiral polymer. Experiments conducted by the inventors of the present invention have revealed that the CISS effect occurs not only in polymers but also in chiral materials (for example, inorganic chiral crystal).

The control section is provided so as to detect a voltage generated in the spin detection layer in a direction that goes across a direction of the electric field or a voltage generated between the spin detection layer and the subject, the spin detection layer being disposed in contact with the subject. Since the voltage to be detected changes depending upon the chirality of the chiral material, the chirality of the chiral material can be detected based upon the detected voltage. This was revealed by the experiments conducted by the inventors of the present invention.

The voltage generated in the spin detection layer is thought to be generated by an inverse spin Hall effect.

The voltage generated between the spin detection layer and the subject is thought to be generated by a similar effect to nonlocal spin valve.

The experiments conducted by the inventors of the present invention made it clear that the inverse of the CISS effect occurs in chiral material (for example, inorganic chiral crystal). When an electric field is applied to the spin detection layer, the electric field brings about the inverse effect related by a reciprocity theorem to the electric field; that is, a voltage is generated in the chiral material. This voltage can be detected using the voltage application section. Since the voltage to be detected changes depending upon the chirality of the chiral material, the chirality of the chiral material can be detected based upon the detected voltage. The experiments conducted by the inventors of the present invention revealed that the chirality detector can perform the reverse process by interchanging the power supply and the control section.

BRIEF DESCRIPTION OF THE DRAWINGS

FIG. 1 shows a diagrammatic perspective view of a chirality detector in accordance with one Embodiment of the present invention.

FIG. 2 shows a diagrammatic perspective view of a chirality detector in accordance with one Embodiment of the present invention.

FIG. 3 shows a diagrammatic perspective view of a chirality detector in accordance with one Embodiment of the present invention.

FIG. 4 shows a diagrammatic perspective view of a chirality detector in accordance with one Embodiment of the present invention.

FIG. 5 shows a diagrammatic perspective view of a chirality detector in accordance with one Embodiment of the present invention.

FIG. 6 shows a diagrammatic view of a separator in accordance with one Embodiment of the present invention.

FIG. 7 shows a diagrammatic view of a separator in accordance with one Embodiment of the present invention.

FIG. 8 shows a diagrammatic perspective view of a chiral material device in accordance with one Embodiment of the present invention.

FIG. 9 shows a photograph of a measuring device prepared to measure $CrNb_3S_6$ as a subject.

FIG. 10 shows a photograph of a measuring device prepared to measure WC as a subject.

FIG. 11 shows a graph showing a change in voltage between electrodes for voltage detection and a graph showing a change in electric resistance value, at a time of applying a voltage to $CrNb_3S_6$ or WC.

FIG. 12 shows a graph showing a change in voltage at a spin detection layer (Pt layer) and a graph showing a change in electric resistance value at the spin detection layer, at a time of applying a voltage to $CrNb_3S_6$ or WC.

FIG. 13 shows a graph showing a change in voltage at a spin detection layer (Pt layer) and a graph showing a change in electric resistance value at the spin detection layer, at a time of applying a voltage to $CrNb_3S_6$.

FIG. 14(a) shows a photograph of a measuring device prepared to measure $CrSi_2$ as a subject; and FIGS. 14(b) and 14(c) show graphs showing results of voltage detection experiments using this device.

FIG. 15(a) shows a photograph of a measuring device prepared to measure $NbSi_2$ as a subject; and FIGS. 15(b) and 15(c) show graphs showing results of voltage detection experiments using this device.

FIG. 16(a) shows a photograph of a measuring device prepared to measure left-handed crystal quartz as a subject; and FIG. 16(b) shows a graph showing results of voltage detection experiments using this device.

FIG. 17(a) shows a photograph of a measuring device prepared to measure right-handed crystal quartz as a subject; and FIG. 17(b) shows a graph showing results of voltage detection experiments using this device.

FIG. 18(a) shows a photograph of a measuring device prepared to measure a chiral molecule dispersion solution as a subject; and FIG. 18(b) shows a graph showing results of voltage detection experiments using this device.

DETAILED DESCRIPTION OF THE INVENTION

A chirality detector of the present invention for detecting chirality of chiral material, comprises: a first electrode and a second electrode that are configured to apply a voltage to a subject containing the chiral material; a spin detection layer configured to be in contact with the subject; a power supply; and a control section, wherein the power supply and the control section are configured to generate an electric field at the subject by applying the voltage between the first electrode and the second electrode; the control section is configured to detect a voltage generated in the spin detection layer in a direction that goes across a direction of the electric field or a voltage generated between the spin detection layer and the subject, and also is configured to detect chirality of the chiral material on the basis of the detected voltage.

It is desirable that the spin detection layer should contain a ferromagnetic body and that the control section should be configured to detect the voltage generated between the spin detection layer and the subject. The voltage to be detected by the control section changes depending upon spin polarization in a similar manner to spin valve, thereby allowing right-handed chiral material and left-handed chiral material to be discriminated from each other.

The present invention provides a chirality detector for detecting chirality of chiral material, comprising: a third electrode and a fourth electrode that are electrically connected with a subject containing the chiral material; a spin injection layer configured to be in contact with the subject; a power supply; and a control section, wherein the power supply and the control section are configured to apply an electric current to the spin injection layer; and the control section is configured to detect, with use of the third electrode and the fourth electrode, a voltage generated in the chiral material in a direction that goes across a direction of the electric current, and also is configured to detect chirality of the chiral material on the basis of the detected voltage.

The present invention also provides a chirality detection method comprising: upon generating an electric field at a subject containing chiral material, detecting a voltage generated in a spin detection layer in a direction that goes across a direction of the electric field or a voltage generated between the spin detection layer and the subject, the spin detection layer being configured to be in contact with the subject; and detecting chirality of the chiral material on the basis of the detected voltage.

The present invention also provides a separator for separating a right-handed form and a left-handed form of chiral material from each other, comprising: a flow channel configured to flow solution, liquid, or gas, any of which containing the right-handed form and the left-handed form; a voltage application section configured to generate an electric field in the solution, the liquid, or the gas flowing through the flow channel; and a magnetic field application section configured to generate a magnetic field in the solution, the liquid, or the gas flowing downstream from the electric field, wherein the separator is characterized by separating the right-handed form and the left-handed form from each other with use of an interaction between the magnetic field and spin polarization of the chiral material that is generated by the electric field.

The present invention also provides a separation method comprising: applying a voltage to solution, liquid, or gas, any of which containing chiral material, so as to generate spin polarization in the chiral material with a right-handed form and a left-handed form; and applying a magnetic field so as to generate a magnetic field in the chiral material-containing solution, liquid, or gas where the spin polarization has been generated, wherein the separation method is characterized by separating the right-handed form and the left-handed form from each other with use of an interaction between the spin polarization and the magnetic field.

Hereinafter, Embodiments of the present invention will be described with reference to the accompanying drawings. Structures shown in the drawings or described below should be recognized as exemplifications in all respects, and the scope of the present invention is not limited to the drawings and the following descriptions.

Chirality Detectors and Chirality Detection Methods

FIGS. 1 to 5 show diagrammatic perspective views of chirality detectors in accordance with the present Embodiments, respectively.

Chirality detectors 20 in accordance with the present Embodiments are configured to detect chirality of chiral material and are characterized by comprising: electrodes for voltage application 3a, 3b configured to apply a voltage to a subject 9 containing the chiral material; a spin detection layer 4 configured to be in contact with the subject 9; a power supply 5; and a control section 7, wherein the power supply 5 and the control section 7 are configured to generate an electric field at the subject 9 by applying a voltage between the electrode for voltage application 3a and the electrode for voltage application 3b; and the control section 7 is configured to detect a voltage generated in the spin detection layer 4 in a direction that goes across a direction of the electric field or a voltage generated between the spin detection layer 4 and the subject 9 and also is configured to detect chirality of the chiral material on the basis of the detected voltage.

Chiral material (chiral substance) is substance having molecular structures with chirality or material having crystal structures with chirality. There are a right-handed form and a left-handed form in the chiral material. The right-handed and the left-handed forms of the chiral material are enantiomers. The chiral material may be inorganic material, macromolecule, organic molecule, or crystal.

The chirality detector 20 is to detect chirality of materials. For example, the chirality detector 20 may be a device that detects whether material contained in the subject 9 has chirality. The chirality detector 20 may also be a device that discriminates that chiral material contained in the subject 9 is right-handed or left-handed or that chiral material is in both right-handed form and left-handed form (for example, a racemic body). Also, the chirality detector 20 may be a device that detects a ratio of a right-handed form and a left-handed form of chiral material. The chirality detector 20 may also be a device that measures a configuration and an anisotropy of chiral material.

The subject 9 is a subject to be subjected to measurements by the chirality detector 20. The subject 9 may be solid, liquid, or gas. If the subject 9 is solid, the subject 9 may be monocrystal, polycrystal, microcrystalline, or aggregate of powder. If the subject 9 is solid, chiral material layers 2 of the chirality detectors 20 shown in FIGS. 1 to 3 are considered subjects 9.

If the subject 9 is liquid, the subject 9 may be a solution containing chiral material molecules, liquid chiral material, a suspension in which chiral material particles are dispersed in the liquid, or liquid crystal.

If the subject 9 is gas, the subject 9 may be gaseous chiral material, mixed gas containing chiral material, or gas in which chiral material microparticles float.

If the subject 9 is liquid or gas, the chirality detector 20, such as those shown in FIGS. 4 and 5, is capable of flowing or storing the subject 9 (chiral material-containing solution, liquid, or gas 11) in a flow channel 16 provided with the electrodes for voltage application 3a, 3b and the spin detection layer 4.

The power supply 5 is to supply electric power to the electrodes for voltage application 3a, 3b. The power supply 5 may be provided in order to supply electric power to the control section 7. The electric power supplied from the power supply 5 to the electrodes for voltage application 3a, 3b may be controlled by the control section 7. The power supply 5 may be a battery or any power supply that uses electric power supplied from an electric power system. The electric power supplied from the power supply 5 to the electrodes for voltage application 3a, 3b can be controlled by the control section 7.

The control section 7 is to control the chirality detector 20. The control section 7 may be a computer, a microcontroller, or a controlling substrate. The control section 7 may comprise a voltage detecting circuit (voltage measuring section 6a, 6b, 6c) or a power controlling circuit.

The electrodes for voltage application 3a, 3b are to apply a voltage to the subject 9. The electrodes for voltage application 3a, 3b are configured in such a way that the voltage is applied between the electrode 3a and the electrode 3b so that an electric field is generated at the subject 9. The electric field generated at the subject 9 with use of the electrodes 3a, 3b can induce electrons to be spin-polarized in the chiral material contained in the subject 9 by virtue of a chirality inductive spin selectivity (CISS) effect.

The CISS effect is an effect that electrons are spin-polarized when the electrons pass through chiral macromolecules. The inventors of the present invention found through experiments that the CISS effect occurred in chiral materials (for example, inorganic chiral crystals) besides the macromolecules.

If the subject 9 is solid, the electrodes for voltage application 3a, 3b may be disposed, for example, at edge(s) or on an upper face of the subject 9, as in the chirality detectors 20 shown in FIG. 1 to FIG. 3.

If the subject 9 is liquid or gas, the electrodes for voltage application 3a, 3b may be disposed, for example, in such a way that an electric field is generated in the flow channel 16, as in the chirality detectors 20 shown in FIGS. 4 and 5. In this case, the electrodes for voltage application 3a, 3b each may be in the form of a plate, a ring, or a mesh.

The spin detection layer 4 is to absorb spins of spin polarization induced in the subject 9. The spin detection layer 4 is disposed so as to be in contact with the subject 9. The spin detection layer 4 may be made of material that is large in conversion efficiency from a spin propagation to an electric charge flow. In this case, the electric charge flow is generated in the spin detection layer 4 due to an inverse spin Hall effect. With the inverse spin Hall effect, the electric charge flow is generated in the spin absorbing material in a direction perpendicular to a spin polarization direction and to a spin propagating direction when the spin absorbing material absorbs the spin polarization. Therefore, a direction and a magnitude of an electromotive force generated in the spin detection layer 4 change depending upon the spin direction of the spin polarization induced in the subject 9.

In this case, the spin detection layer 4 may be disposed as in the chirality detectors 20 shown in FIGS. 1, 2, 4, and 5.

The spin detection layer 4 is preferably made of spin absorbing material with a large spin Hall angle. Examples of the spin absorbing material include material whose spin orbit interaction is large (such as Pt and W), a topological insulator, (Weyl) semimetal, a two-dimensional gas system, a hybrid film such as metal/oxide or metal/molecule, oxide, molecule, dielectric, semiconductor, and a Rashba system.

The spin detection layer 4 may be made of ferromagnetic material. When such a spin detection layer 4 is in contact with the subject 9, the spin polarization of the chiral material contained in the subject 9 can generate an electromotive force between the spin detection layer 4 and the subject 9, which similar to a spin valve. In this case, it is desirable that a shape of the spin detection layer 4 should be anisotropic so as to become magnetized uniformly.

In this case, the spin detection layer 4 may be disposed as in the chirality detector 20 shown in FIG. 3.

The spin detection layer 4 may be placed, for example, between the electrode for voltage application 3a and the electrode for voltage application 3b, as in the chirality detectors 20 shown in FIG. 1 and FIG. 4. The spin detection layer 4 may not be placed between the electrode for voltage application 3a and the electrode for voltage application 3b, as in the chirality detectors 20 shown in FIGS. 2, 3, and 5. The spin polarization generated in the chiral material of the subject 9 with use of the electrodes for voltage application 3a, 3b is generated not only in a portion of the chiral material between the electrode 3a and the electrode 3b but also in a portion of the chiral material of the subject 9 that has not induced the electric field. This became clear by experiments carried out by the inventors of the present invention.

The chirality detector 20 may have electrodes for voltage detection 8a to 8c. For example, the chirality detector 20 shown in FIG. 1 has the electrodes 8a, 8b provided so as to detect a voltage in an x direction of the subject 9. The chirality detector 20 shown in FIG. 3 has the electrode 8c electrically connected with the subject 9 and is capable of detecting a voltage between the spin detection layer 4 and the subject 9 with use of the electrode 8c.

The electrodes for voltage application 3a, 3b, the spin detection layer 4, the electrodes for voltage detection 8a to 8c, and so forth may be formed, for example, by a vapor deposition method, a spraying method, an application method, or the like.

Next, methods for detecting chirality of the chiral material contained in the subject 9 using the chirality detectors 20 will be described. The below-described methods can be carried out by controlling the chirality detectors 20 by the control section 7. The control section 7 is provided in order to carry out the following methods. Also, the following methods may be carried out manually without using the control section 7.

The detection methods using the chirality detectors 20 shown in FIGS. 1, 2, 4, and 5 will be described. With these methods, a magnetic field is not applied to the subject 9. With these chirality detectors, the voltage measuring section 6a or the control section 7 is provided so as to detect a voltage in a y direction of the spin detection layer 4. The spin detection layer 4 may be made of material that can convert the spin polarization into an electric charge flow. Examples of the material for the spin detection layer 4 include Pt and W.

Firstly, a voltage is applied between the electrode for voltage application 3a and the electrode for voltage application 3b, generating an electric field at the subject 9. The electric field generated in this way is capable of generating a spin polarization in the chiral material contained in the subject 9 due to a chirality inductive spin selectivity (CISS) effect. It is believed that a polarization direction of the spin polarization that occurs when the subject 9 contains right-handed chiral material is opposite to a polarization direction of the spin polarization that occurs when the subject 9 contains left-handed chiral material.

Secondly, with use of the voltage measuring section 6a or the control section 7, a voltage in a y direction of the spin detection layer 4 is detected. Since the spin detection layer 4 is placed to be in contact with the subject 9, the chiral material contained in the subject 9 is in contact with the spin detection layer 4, allowing the spin polarization of the chiral material to induce an electric charge flow in the spin detection layer 4 due to an inverse spin Hall effect. Since the polarization direction of the spin polarization of the right-handed chiral material is opposite to the polarization direction of the spin polarization of the left-handed chiral material, it is believed that a direction of the electric charge flow of the right-handed chiral material also becomes opposite to a direction of the electric charge flow of the left-handed chiral material in the spin detection layer 4, allowing a direction of an electromotive force of the right-handed chiral material to become opposite to a direction of an electromotive force of the left-handed chiral material. This make it possible to detect a voltage in the y direction of the spin detection layer 4 with use of the voltage measuring section 6a or the control section 7 and to compare the direction and the magnitude of the electromotive force with discriminant criteria, with the result that it is possible to discriminate that the chiral material contained in the subject 9 is right-handed or left-handed.

The detection method using the chirality detector 20 shown in FIG. 3 will be described. In this detector, ferromagnetic material is used as material for the spin detection layer 4. The voltage measuring section 6a or the control section 7 is placed so as to detect a voltage between the spin detection layer 4 and the subject 9. With this method, a magnetic field is not applied to the subject 9, except for a magnetic field generated from the spin detection layer 4.

Firstly, a voltage is applied between the electrode for voltage application 3a and the electrode for voltage application 3b, generating an electric field at the subject 9. The electric field generated in this way is capable of generating a spin polarization in the chiral material contained in the subject 9 due to a chirality inductive spin selectivity (CISS) effect.

Secondly, with use of the voltage measuring section 6a or the control section 7, a voltage between the spin detection layer 4 and the subject 9 is detected. Since the spin detection layer 4 made of a ferromagnetic body is placed to be in contact with the subject 9, a spin polarization of the chiral material generates an electromotive force between the spin detection layer 4 and the subject 9, depending upon a magnetization state of the ferromagnetic body, which similar to a nonlocal spin valve. Since the polarization direction of the spin polarization of the right-handed chiral material is opposite to the polarization direction of the spin polarization of the left-handed chiral material, the electromotive force, which is generated between the spin detection layer 4 and the subject 9, of the right-handed chiral material is different from the electromotive force generated in the left-handed chiral material. This makes it possible to detect a voltage between the spin detection layer 4 and the subject 9 with use of the voltage measuring section 6a or the control section 7 and to compare the direction and the magnitude of the electromotive force with discriminant criteria, with the result that it is possible to discriminate that the chiral material contained in the subject 9 is right-handed or left-handed.

Chirality Detector in which the Inverse of CISS Effect is Used

The above-described chirality detectors 20 are configured to detect the chirality of the chiral materials by using the CISS effect. In the present Embodiments, chirality of chiral material is detected by using an inverse effect of the CISS effect. In the present Embodiment, the above-described spin detection layer 4 functions as a spin injection layer 4; and the above-described electrodes for voltage application 3a, 3b function as electrodes for voltage detection 3a, 3b, respectively, that are configured to detect a voltage generated in the subject 9. A structure of a detector in accordance with the present Embodiment is the same as the above-described chirality detectors 20.

A chirality detector 20 in accordance with the present Embodiment is configured to detect chirality of chiral material and is characterized by comprising: an electrode 3a and an electrode 3b that are electrically connected with a subject 9 containing the chiral material; a spin injection layer 4 configured to be in contact with the subject 9; a power supply 5; and a control section 7, wherein the power supply 5 and the control section 7 are configured to apply an electric current to the spin injection layer 4; and the control section 7 is configured to detect, with use of the electrode 3a and the electrode 3b, a voltage generated in the chiral material in a direction that goes across a direction of the electric current, and also is configured to detect chirality of the chiral material on the basis of the detected voltage.

In the present Embodiment, the power supply 5 is to supply electric power to the spin injection layer 4; and the control section 7 is configured to detect the voltage with use of the electrodes 3a, 3b and to detect the chirality of the chiral material on the basis of the detected voltage.

Separators and Separation Methods

FIG. 6 and FIG. 7 show schematic views of separators in accordance with the present Embodiments, respectively.

Separators 25 in accordance with the present Embodiments are configured to separate a right-handed form and a left-handed form of chiral material from each other, each of the separators being characterized by comprising: a flow channel 16 configured to flow solution, liquid, or gas, any of which containing the right-handed form and the left-handed form; a voltage application section 12 configured to generate an electric field in the solution, the liquid, or the gas flowing through the flow channel 16; and a magnetic field application section 13 configured to generate a magnetic field in the solution, the liquid, or the gas flowing downstream from the electric field, wherein the separators each are characterized by separating the right-handed form and the left-handed form from each other with use of an interaction between the magnetic field and spin polarization of the chiral material that is generated by the electric field.

The separators 25 in accordance with the present Embodiments are to separate right-handed chiral material 17 and left-handed chiral material 18 from each other in the solution, the liquid, or the gas. The solution, the liquid, or the gas before the separation contains both the right-handed chiral material 17 and the left-handed chiral material 18.

The separators 25 each in accordance with the present Embodiments is provided with the flow channel 16 configured to flow chiral material-containing solution, liquid, or gas 11. The flow channel 16 is provided with electrodes for voltage application 3a, 3b (voltage application sections 12) configured to generate an electric field in the chiral material-containing solution, liquid, or gas 11. The electrodes for voltage application 3a, 3b may be disposed in such a way that a direction of the generated electric field becomes parallel to a direction of the flow in the flow channel 16.

The electric field generated by applying a voltage between the electrode 3a and the electrode 3b with use of a power supply 5a (voltage application section 12) can generate a spin polarization at the right-handed chiral material 17 and the left-handed chiral material 18, both of the materials flowing through the flow channel 16, due to a chirality inductive spin selectivity (CISS) effect. It is believed that a polarization direction of the spin polarization generated at the right-handed chiral material 17 is opposite to a polarization direction of the spin polarization generated at the left-handed chiral material 18. The relation between the directions of the right-handed chiral material 17 and the left-handed chiral material 18 indicated by arrows in FIG. 6 and FIG. 7 is schematic and is not limited to these directions.

The magnetic field application section 13 is placed in such a way as to generate a magnetic field at the flow channel 16 that is downstream from the electric field generated between the electrode for voltage application 3a and the electrode for voltage application 3b. The magnetic field application section 13 may include, for example, power supplys 5a, 5b, 5c and coils 19, 19a, 19b. Magnetic field application sections 13, 13a, 13b each may be made of permanent magnet or micro-magnet. The magnetic field application sections 13, 13a, 13b may be disposed so that a direction of the magnetic field generated in the flow channel 16 becomes parallel to a flow direction in the flow channel 16, a direction of the electric field generated between the electrode for voltage application 3a and the electrode for voltage application 3b, or the spin polarization directions of the right-handed chiral material 17 and the left-handed chiral material 18.

The magnetic field application section 13 may be disposed as in, for example, the separator 25 shown in FIG. 6. The coil 19 of this separator is placed to wrap around the flow channel 16; and a direct current is applied to this coil 19 by the power supply 5b. This makes it possible to generate a magnetic field that is parallel to the flow direction in the flow channel 16.

When the right-handed chiral material 17 having the spin polarization generated thereat and the left-handed chiral material 18 having the spin polarization generated thereat flow through such a magnetic field, one of the right-handed chiral material 17 and the left-handed chiral material 18 in the flow channel 16 becomes faster in flow speed due to the relation between the polarization direction of the spin polarization and the direction of the magnetic field, whereas the other one becomes slower in flow speed in the flow channel 16. This makes it possible to separate the right-handed chiral material 17 and the left-handed chiral material 18 from each other in the flow in the flow channel 16. This separator 25 thus separates the right-handed chiral material 17 and the left-handed chiral material 18 from each other in a chromatography manner.

The magnetic field application sections 13a, 13b may be disposed as in, for example, the separator 25 shown in FIG. 7. The magnetic field application sections 13a, 13b are disposed so as to form the magnetic fields in the flow channel 16 by using leakage magnetic fields. The magnetic field application section 13a includes the power supply 5b and the coil 19a and is disposed so as to form the leakage magnetic field in the flow channel 16. The magnetic field application section 13b includes the power supply 5c and the coil 19b and is disposed so as to form the leakage magnetic field at the flow channel 16. The magnetic field formed by the magnetic field application section 13a and the magnetic field formed by the magnetic field application section 13b are located at the same channel cross-section.

When the right-handed chiral material 17 at which the spin polarization has been generated and the left-handed chiral material 18 at which the spin polarization has been generated flow through such magnetic fields, the relation between the polarization direction of the spin polarization and the direction of the magnetic field allows one of the right-handed chiral material 17 and the left-handed chiral material 18 to flow through the magnetic field formed by the magnetic field application section 13a, and allows the other chiral material to flow through the magnetic field formed by the magnetic field application section 13b. This makes it possible to separate the right-handed chiral material 17 and the left-handed chiral material 18 from each other in the flow in the flow channel 16.

The flow channel 16 is branched in such a way that the chiral material having flowed through the magnetic field formed by the magnetic field application section 13a flows through the flow channel 16a, and that the chiral material having flowed through the magnetic field formed by the magnetic field application section 13b flows through the flow channel 16b. This makes it possible to prevent the right-handed chiral material 17 and the left-handed chiral material 18 from being mixed together, both of said chiral materials having been separated using the magnetic fields. This thus makes it possible to collect the chiral materials from the flow channel 16a and the flow channel 16b, respectively, and to collect the right-handed chiral material 17 and the left-handed chiral material 18 separately.

Chiral Material Device

FIG. 8 shows a diagrammatic perspective view of a chiral material device in accordance with the present Embodiment.

A chiral material device 30 in accordance with the present Embodiment is characterized by comprising: a chiral material layer 2; a first electrode for voltage application 3a and a second electrode for voltage application 3b that are configured to generate an electric field at the chiral material layer 2; and a spin detection layer 4 configured to be in contact with the chiral material layer 2, wherein the first electrode for voltage application 3a and the second electrode for voltage application 3b are provided so that at least one of the first electrode for voltage application 3a and the second electrode for voltage application 3b inputs an input signal and are configured to generate the electric field at the chiral material layer 2 by inputting the input signal; and the chiral material device 30 is characterized in that a voltage generated in a direction across the electric field of the spin detection layer 4 changes according to the input signal.

The chiral material device 30 is a device that uses properties of chiral material, and may be a transistor, a memory, or a logic device.

The chiral material layer 2 is a layer that contains chiral material. The chiral material layer 2 may mainly contain either right-handed chiral material or left-handed chiral material. The chiral material layer 2 may have a structure formed of a layer comprising the right-handed chiral material and a layer comprising the left-handed chiral material.

The chiral material layer 2 may be made of single crystal, polycrystalline, microcrystalline, liquid crystal, or aggregate of powder. The chiral material layer 2 may be made of gel containing chiral material. The chiral material layer 2 may be made of a conductor, a semiconductor, or an insulator.

The first electrode for voltage application 3a and the second electrode for voltage application 3b are configured to generate an electric field in the chiral material layer 2. By applying a voltage between the first electrode for voltage application 3a and the second electrode for voltage application 3b, the electric field is generated in the chiral material layer 2. The chiral material device 30 may have the pair of electrodes for voltage application 3a, 3b, as in the device shown in FIG. 8, or may have a plurality of pairs of electrodes for voltage application 3a, 3b.

The electric field generated at the chiral material layer 2 by using the electrodes 3a, 3b is capable of generating spin-polarized electrons in the chiral material contained in the chiral material layer 2 due to a chirality inductive spin selectivity (CISS) effect. If a direction of the electric field generated at the chiral material layer 2 changes, a direction of the spin polarization changes.

The spin detection layer 4 is configured to absorb spins of the spin polarization generated in the chiral material layer 2. The spin detection layer 4 may be arranged, for example, between the electrodes for voltage application 3a, 3b, as in the chiral material device 30 shown in FIG. 8. The spin detection layer 4, however, does not have to be arranged between the electrodes for voltage application 3a, 3b.

When the plurality of pairs of electrodes for voltage application 3a, 3b are arranged, a plurality of spin detection layers 4 may be placed between the pair of electrodes for voltage application 3a, 3b and the adjacent pair of electrodes for voltage application 3a, 3b. This makes it possible to select the spin detection layer 4 that outputs an output signal.

An input section 26 is configured to input an input signal to at least one of the electrodes for voltage application 3a, 3b and to generate an electric field between the electrode for voltage application 3a and the electrode for voltage application 3b at the chiral material layer 2. This allows the electric field that changes according to the input signal to be formed at the chiral material layer 2. For example, the input section 26 may be disposed so that a direction of the electric field to be generated in the chiral material layer 2 changes according to the input signal. When the direction of the electric field of the chiral material layer 2 changes, a direction of the spin polarization of the chiral material layer 2 also changes. Therefore, when the spin detection layer 4 is placed as in the device 30 shown in FIG. 8, a direction of the voltage generated in the spin detection layer 4 in a direction across the electric field also changes according to the input signal. By outputting the direction of this voltage from an output section 27 as the output signal, the input signal can be converted into the output signal.

The above descriptions of the chirality detectors 20 and other components hold true with the chiral material device unless there is any contradiction.

First Chirality Detection Experiment

A device A similar to the device in FIG. 1 was prepared using $CrNb_3S_6$, which is chiral material, as a subject. For the $CrNb_3S_6$, single crystal having a size of 16.9 μm×9.5 μm×500 nm was used. The $CrNb_3S_6$ was arranged so that a c-axis (spiral axis) of the $CrNb_3S_6$ was positioned in an x direction. For the spin detection layer, a Pt layer having a size of 2 μm×9.5 μm×25 nm was used. The resistivity of the Pt layer was 450 μΩcm, and the resistivity of the $CrNb_3S_6$ single crystal was 650 μΩcm.

FIG. 9 shows a photograph of the device A as prepared above. Wirings (1) and (2) function as electrodes for voltage application, and are to apply a voltage in the x direction of the CrNb$_3$S$_6$ single crystal. Wirings (5) and (6) function as electrodes for voltage detection, and are to detect a voltage in the x direction of the CrNb$_3$S$_6$ single crystal. Wirings (4) and (8) function as electrodes connected to ends of the Pt layer, respectively, and are to detect a voltage in a y direction of the Pt layer.

A device B similar to the device was prepared using WC (tungsten carbide), which is non-chiral material, as a subject. For the WC, one having a size of 16.4 μm×8.4 μm×40 nm was used. For the spin detection layer, a Pt layer having a size of 2 μm×8.4 μm×25 nm was used. The resistivity of the Pt layer is 450 μΩcm, and the resistivity of the WC is 530 μΩcm.

FIG. 10 shows a photograph of the device B as prepared above. Wirings (1) and (2) function as electrodes for voltage application, and are to apply a voltage in an x direction of the WC. Wirings (4) and (5) function as electrodes for voltage detection, and are to detect a voltage in the x direction of the WC. Wirings (3) and (6) function as electrodes connected to ends of a Pt layer, respectively, and are to detect a voltage in a y direction of the Pt layer.

The voltage applied between the wirings (1) and (2) was changed so that an electric current flowing through the CrNb$_3$S$_6$ single crystal of the device A (from (1) to (2)) would change from −5 mA to 5 mA, thereby measuring a voltage $V_{xx}$ (the voltage in the x direction of the CrNb$_3$S$_6$ single crystal) between the wirings (5) and (6) and a voltage $V_{xy}$ (the voltage in the y direction of the Pt layer) between the wirings (4) and (8). From the measured values, a resistance value $R_{xx}$ of the CrNb$_3$S$_6$ single crystal and a resistance value $R_{xy}$ of the Pt layer were calculated.

An electric current value when the electric current flowed through the CrNb$_3$S$_6$ single crystal from the wiring (1) to the wiring (2) was set to be plus, and an electric current value when the electric current flowed from the wiring (2) to the wiring (1) was set to be minus. The voltage $V_{xx}$ was set to a plus voltage when an electric potential of the wiring (5) was higher than an electric potential of the wiring (6). The voltage $V_{xy}$ was set to a plus voltage when an electric potential of the wiring (4) (which is on the right side when facing a direction of the plus electric current flowing through the CrNb$_3$S$_6$) was higher than an electric potential of the wiring (8) (which is on the left side when facing the direction of the plus electric current flowing through the CrNb$_3$S$_6$).

The voltage applied between the wirings (1) and (2) was changed so that an electric current flowing through the WC of the device B (from (1) to (2)) would change from −5 mA to 5 mA, thereby measuring a voltage $V_{xx}$ (the voltage in the x direction of the WC) between the wirings (4) and (5) and a voltage $V_{xy}$ (the voltage in the y direction of the Pt layer) between the wirings (3) and (6). From the measured values, a resistance value $R_{xx}$ of the WC and a resistance value $R_{xy}$ of the Pt layer were calculated.

An electric current value when the electric current flowed through the WC from the wiring (1) to the wiring (2) was set to be plus, and an electric current value when the electric current flowed from the wiring (2) to the wiring (1) was set to be minus. The voltage $V_{xx}$ was set to a plus voltage when an electric potential of the wiring (4) was higher than an electric potential of the wiring (5). The voltage $V_{xy}$ was set to a plus voltage when an electric potential of the wiring (3) (which is on the right side when facing a direction of the plus electric current flowing through the WC) was higher than an electric potential of the wiring (6) (which is on the left side when facing the direction of the plus electric current flowing through the WC).

FIG. 11(a) shows a graph showing a change in the measured voltage value $V_{xx}$ in a horizontal direction; and FIG. 11(b) shows a graph showing a change in the calculated resistance value $R_{xx}$. In both devices A and B, the $V_{xx}$ changed according to the voltage applied between the wirings (1) and (2). The $R_{xx}$ was constant.

FIG. 12(a) shows a graph showing a change in the measured voltage value $V_{xy}$ in a vertical direction of the Pt layer; and FIG. 12(b) shows a graph showing a change in the calculated resistance value $R_{xy}$. In the device B (using the WC), the $V_{xy}$ was not outputted, and the $R_{xy}$ was zero, whereas in the device A (using the CrNb$_3$S$_6$), when the voltage was applied to the CrNb$_3$S$_6$ so that the plus electric current flowed through it, the plus voltage $V_{xy}$ was generated in the Pt layer, and when the voltage was applied to the CrNb$_3$S$_6$ so that the minus electric current flowed through it, the minus voltage $V_{xy}$ was generated in the Pt layer. The voltage $V_{xy}$ and an electric current I that has flowed through the CrNb$_3$S$_6$ were proportional to each other. In the device A, the $R_{xy}$ showed a slightly nonlinear behavior as the electric current I flowing through the CrNb$_3$S$_6$ increased.

It was thus found that when the subject was the chiral material, and the electric current was applied to the subject, an electromotive force was generated in the Pt layer, which was the spin detection layer. From this finding, it was also found that it was possible to discriminate whether or not the subject was the chiral material by applying the electric current to the subject and examining whether or not the electromotive force was generated in the spin detection layer.

The reason why the electromotive force was generated in the spin detection layer is thought to be that the chirality inductive spin selectivity (CISS) effect has generated a spin-polarized state in the chiral material; and this spin-polarized state was converted into the electric charge flow in the Pt (the spin detection layer), which is the material with the large spin orbit interaction, by the inverse spin Hall effect.

Next, a voltage $V_{xy}$ (the voltage in the y direction of the Pt layer) was measured with use of different electrodes for voltage application in the device A. More specifically, the voltage $V_{xy}$ (the voltage in the y direction of the Pt layer) between the wirings (4) and (8) was measured when an electric current was passed from the wiring (5) to the wiring (2) as shown by a solid arrow in FIG. 13(a). Also, the voltage $V_{xy}$ (the voltage in the y direction of the Pt layer) between the wirings (4) and (8) was measured when an electric current was passed from the wiring (6) to the wiring (2) as shown by a dotted arrow in FIG. 13(a). A resistance value $R_{xy}$ of the Pt layer was calculated from the voltages $V_{xy}$.

A distance between the electrodes for voltage application (which is the distance where the electric current flows in the CrNb$_3$S$_6$ single crystal) is longer for the solid arrow than for the dotted arrow. The plus and the minus of the electric current I and the plus and the minus of the voltage $V_{xy}$ are the same as the measurements as in the device A described above.

FIG. 13(b) shows a graph showing a change in voltage $V_{xy}$, and FIG. 13(c) shows a graph showing a change in resistance value $R_{xy}$. Similar to the measurement results for the device A shown in FIG. 12(a), when the voltage was applied to the CrNb$_3$S$_6$ so that the plus electric current flowed through it, the plus voltage $V_{xy}$ was generated in the Pt layer, and when the voltage was applied to the CrNb$_3$S$_6$ so that the minus electric current flowed through it, the minus voltage $V_{xy}$ was generated in the Pt layer.

It was thus found that an electromotive force was generated in the spin detection layer even when the Pt layer, which was the spin detection layer, was not arranged between the electrodes for voltage application.

The reason why the electromotive force was generated in the spin detection layer placed to be in contact with a region of the chiral material where the electric current was not flowing is thought to be that the spin-polarized state generated in the chiral material due to the chirality inductive spin selectivity (CISS) effect has induced the spin polarization in the region where the electric current was not flowing. It is thought that this induced spin polarization has been converted to the electric charge flow in the Pt (the spin detection layer) by the inverse spin Hall effect, thereby generating the electromotive force. It was found that the electromotive force was detectable over a relatively long distance, although it could change depending upon the distance. More specifically, in addition to detecting the signals as small as a few micrometers (μm), the signals up to a distance of about 10 mm are detected.

Chirality Discrimination Experiments

Experiments were carried out to confirm whether left-handed and right-handed forms of chiral material can be discriminated from each other on account of an electromotive force generated in a spin detection layer.

Bulk polycrystal of $CrSi_2$ ($P6_422$ ($D_6^5$)) was used as left-handed chiral material. The $CrSi_2$ has a crystal structure with a left-handed helical atomic arrangement. The orientation of a spiral axis in the polycrystal is uneven (unoriented sample).

FIG. 14(a) shows a photograph of a device C prepared using the $CrSi_2$ bulk polycrystal. The $CrSi_2$ bulk polycrystal is provided with wirings (1) and (2), which function as electrodes for voltage application, at both ends of the polycrystal, respectively. The device C had two Pt layers placed between wirings (1) and (2); and wirings (3) and (5) were connected to both ends of the left Pt layer, respectively; and wirings (4) and (6) were connected to both ends of the right Pt layer, respectively.

A voltage applied between the wirings (1) and (2) was changed so that an electric current (from (1) to (2)) flowing through the $CrSi_2$ bulk polycrystal of the device C would change from −21 mA to 21 mA, thereby measuring a voltage $V_{xx}$ (the voltage in an x direction of the $CrSi_2$ bulk polycrystal) between the wirings (3) and (4) and a voltage $V_{xy}$ (the voltage in a y direction of the Pt layer) between the wirings (4) and (6).

An electric current value when the electric current flowed through the $CrSi_2$ bulk polycrystal from the wiring (1) to the wiring (2) was set to be plus, and an electric current value when the electric current flowed from the wiring (2) to the wiring (1) was set to be minus. The voltage $V_{xx}$ was set to a plus voltage when an electric potential of the wiring (3) was higher than an electric potential of the wiring (4). The voltage $V_{xy}$ was set to a plus voltage when an electric potential of the wiring (4) (which is on the right side when facing a direction of the plus electric current flowing through the $CrSi_2$ bulk polycrystal) was higher than an electric potential of the wiring (6) (which is on the left side when facing the direction of the plus electric current flowing through the $CrSi_2$ bulk polycrystal).

FIG. 14(b) shows a graph showing a change in measured voltage value $V_{xx}$ in the x direction; and FIG. 14(c) shows a graph showing a change in measured voltage value $V_{xy}$ in the y direction of the Pt layer. The voltage value $V_{xx}$ has changed depending upon the voltage applied between the wirings (1) and (2). The voltage value $V_{xy}$ became minus when the voltage was applied, and the plus electric current flowed through the $CrSi_2$ bulk polycrystal, and became plus when the voltage was applied, and the minus electric current flowed through the $CrSi_2$ bulk polycrystal. The voltage $V_{xy}$ and the electric current I flowing through the $CrSi_2$ bulk polycrystal had a proportionality relation in which a proportionality constant was minus.

As the right-handed chiral material, bulk polycrystal of $NbSi_2$ ($P6_422$ ($D_6^4$)) was used. The $NbSi_2$ has a crystal structure with a right-handed helical atomic arrangement. The orientation of a spiral axis in the polycrystal is uneven (unoriented sample).

FIG. 15(a) shows a photograph of a device D prepared using the $NbSi_2$ bulk polycrystal. The $NbSi_2$ bulk polycrystal is provided with wirings (1) and (2), which function as electrodes for voltage application, at both ends of the polycrystal, respectively. The device D had two Pt layers placed between the wirings (1) and (2); and wirings (3) and (5) were connected to both ends of the left Pt layer, respectively; and wirings (4) and (6) were connected to both ends of the right Pt layer, respectively.

A voltage applied between the wirings (1) and (2) was changed so that an electric current (from (1) to (2)) flowing through the $NbSi_2$ bulk polycrystal of the device D would change from −21 mA to 21 mA, thereby measuring a voltage $V_{xx}$ (the voltage in an x direction of the $NbSi_2$ bulk polycrystal) between the wirings (5) and (6) and a voltage $V_{xy}$ (the voltage in a y direction of the Pt layer) between the wirings (4) and (6).

An electric current value when the electric current flowed through the $NbSi_2$ bulk polycrystal from the wiring (1) to the wiring (2) was set to be plus, and an electric current value when the electric current flowed from the wiring (2) to the wiring (1) was set to be minus. The voltage $V_{xx}$ was set to a plus voltage when an electric potential of the wiring (5) was higher than an electric potential of the wiring (6). The voltage $V_{xy}$ was set to a plus voltage when an electric potential of the wiring (4) (which is on the right side when facing a direction of the plus electric current flowing through the $NbSi_2$ bulk polycrystal) was higher than an electric potential of the wiring (6) (which is on the left side when facing the direction of the plus electric current flowing through the $NbSi_2$ bulk polycrystal).

FIG. 15(b) shows a graph showing a change in measured voltage value $V_{xx}$ in the x direction; and FIG. 15(c) shows a graph showing a change in measured voltage value $V_{xy}$ in the y direction of the Pt layer. The voltage value $V_{xx}$ has changed depending upon the voltage applied between the wirings (1) and (2). The voltage value $V_{xy}$ became plus when the voltage was applied, and the plus electric current flowed through the $NbSi_2$ bulk polycrystal, and became minus when the voltage was applied, and the minus electric current flowed through the $NbSi_2$ bulk polycrystal. The voltage $V_{xy}$ and the electric current I flowing through the $NbSi_2$ bulk polycrystal had a proportionality relation in which a proportionality constant was plus.

From these experiments, it was found that the direction of the electromotive force generated in the spin detection layer of the device using the right-handed chiral material was opposite to the direction of the electromotive force generated in the spin detection layer of the device using the left-handed chiral material. It was then found from this result that it was possible to discriminate whether the chiral material was right-handed or left-handed by applying the electric current to the subject (chiral material) and examining the direction of the electromotive force generated in the spin detection layer.

The reason why the directions of the electromotive forces generated in the spin detection layer are opposite to each other is thought to be that the polarization direction of the spin-polarized state of the chiral material is reversed between the right-handed form and the left-handed form due to the chirality inductive spin selectivity (CISS) effect. Therefore, the direction of the electromotive force of the right-handed form in the spin detection layer is also thought to be opposite to the direction of the electromotive force of the left-handed form, both of the forces being generated by the conversion of a spin propagation by the inverse spin Hall effect.

Since the electromotive forces were generated in the spin detection layers of the devices C and D, which used the polycrystalline chiral materials as the unoriented samples, it was found that the directions of the electromotive forces generated in the spin detection layer were determined by whether the chiral material was right-handed or left-handed, regardless of the directions of the spin axes. Therefore, the CISS effect was found to be brought about at a molecular level (or a crystal level) of the chiral material. This suggests that chiral material in a solution, liquid crystal that is chiral material, and an insulator that is chiral material can likewise discriminate between a right-handed form and a left-handed form.

Second Chirality Detection Experiment

In the first chirality detection experiment and the chirality discrimination experiments described above, the conductors were used as the chiral materials, which were the subjects, while a second chirality detection experiment was carried out using left-handed crystal quartz and right-handed crystal quartz, which are insulators, as subjects. The left-handed crystal quartz is left-handed chiral material with a left-handed helical atomic arrangement in a crystal structure, and the right-handed crystal quartz is right-handed chiral material with a right-handed helical atomic arrangement in a crystal structure. Since the crystal quartzes are the insulators, no electric current flows through the chiral materials. Therefore, the measurement was performed by using an inverse effect of the CISS effect. In other words, a voltage is applied to both ends of a Pt layer, and a voltage generated in the chiral materials is detected.

FIG. 16(a) shows a photograph of a device E prepared using the left-handed crystal quartz. The left-handed crystal quartz is provided with wirings (1) and (2), which function as electrodes for voltage detection, at both ends of the left-handed crystal quartz, respectively. The device E had a Pt layer placed between the wirings (1) and (2); and wirings (3) and (4) were connected to both ends of the Pt layer, respectively. This Pt layer functioned as the spin detection layer in the first chirality detection experiment; however, in the second chirality detection experiment using the inverse effect, the Pt layer functions as an electrode for voltage application.

A voltage $V_{yx}$ (the voltage in an x direction of the crystal quartz) between the wiring (1) and the wiring (2) was measured by changing a voltage (pulse voltage) to be applied to the Pt layer by using the wirings (3) and (4).

An electric current value when the electric current flowed through the Pt layer from the wiring (3) to the wiring (4) was set to be plus, and an electric current value when the electric current flowed from the wiring (4) to the wiring (3) is set to be minus. The voltage $V_{yx}$ was set to a plus voltage when an electric potential of the wiring (1) (which is on the right side when facing a direction of the plus electric current flowing through the Pt layer) was higher than an electric potential of the wiring (2) (which is on the left side when facing the direction of the plus electric current flowing through the Pt layer).

FIG. 16(b) shows a graph showing a change in measured voltage value $V_{yx}$ in the x direction of the crystal quartz. In FIG. 16(b), the voltage applied to the Pt layer is indicated as an electric current value I (mA).

By changing the voltage applied to the wirings (3) and (4), an electromotive force was generated in the crystal quartz. The measured voltage value $V_{yx}$ generated in the left-handed crystal quartz and the voltage applied to the Pt layer had a proportionality relation in which a proportionality constant was minus. Such a tendency in the change of the voltage value $V_{yx}$ was similar to those seen in the first chirality detection experiment and the chirality discrimination experiments.

FIG. 17(a) shows a photograph of a device F prepared using the right-handed crystal quartz. The right-handed crystal quartz is provided with wirings (1) and (2), which function as electrodes for voltage detection, at both ends of the right-handed crystal quartz, respectively. The device F had a Pt layer placed between wirings (1) and (2); and wirings (3) and (4) were connected to both ends of the Pt layer, respectively. This Pt layer functioned as the spin detection layer in the first chirality detection experiment, but functions as an electrode for voltage application when using the inverse effect.

A voltage $V_{yx}$ (the voltage in an x direction of the crystal quartz) between the wiring (1) and the wiring (2) was measured by changing a voltage (pulse voltage) to be applied to the Pt layer by using the wirings (3) and (4).

An electric current value when the electric current flowed through the Pt layer from the wiring (3) to the wiring (4) was set to be plus, and an electric current value when the electric current flowed from the wiring (4) to the wiring (3) is set to be minus. The voltage $V_{yx}$ was set to a plus voltage when an electric potential of the wiring (1) (which is on the right side when facing a direction of the plus electric current flowing through the Pt layer) was higher than an electric potential of the wiring (2) (which is on the left side when facing the direction of the plus electric current flowing through the Pt layer).

FIG. 17(b) shows a graph showing a change in measured voltage value $V_{yx}$ in the x direction of the right-handed crystal quartz. In FIG. 17(b), the voltage applied to the Pt layer is indicated as an electric current value I (mA).

By changing the voltage applied to the wirings (3) and (4), an electromotive force was generated in the crystal quartz. The measured voltage value $V_{yx}$ generated in the right-handed crystal quartz and the voltage applied to the Pt layer had a proportionality relation in which a proportionality constant was plus. A tendency in the change of the voltage value $V_{yx}$ was similar to those seen in the first chirality detection experiment and the chirality discrimination experiments.

From the experimental results of the device E and the device F, it was found that it was possible to discriminate whether the insulating chiral material was right-handed or left-handed by examining the direction of the electromotive force generated in the chiral material.

The reason why the electromotive force was generated in the insulating chiral materials of the device E and the device F is thought to be as follows. When the voltage is applied to the Pt layer, a spin propagation is injected into the chiral material from the Pt layer due to the spin Hall effect, resulting in spin polarization in the chiral material. This spin polarization of the chiral material is thought to generate the electromotive force in the chiral material due to the inverse effect of the chirality inductive spin selectivity (CISS) effect.

Third Chirality Detection Experiment

A third chirality detection experiment was carried out using a chiral molecule dispersion solution, in which tartaric acid (chiral molecule) is dispersed, as a subject.

FIG. 18(a) shows a photograph of a device G. For the device G, three platinum electrodes are provided on a glass substrate: To both ends of the upper platinum electrode, wirings (1) and (2) are connected, respectively; to both ends of the middle platinum electrode, wirings (3) and (4) are connected, respectively; and to both ends of the lower platinum electrode, wirings (5) and (6) are connected, respectively. The chiral molecule dispersion solution is dropped onto the substrate so that it overlaps the three platinum electrodes.

A voltage applied between the wirings (2) and (6) was changed so that an electric current (the electric current flowing from the upper platinum electrode to the lower platinum electrode) flowing through the chiral molecule dispersion solution of the device G would change from −100 μA to +100 μA, thereby measuring a voltage V between the wirings (3) and (4).

An electric current value when the electric current flows through the chiral molecule dispersion solution from the wiring (2) to the wiring (6) was set to be plus, and an electric current value when the electric current flows from the wiring (6) to the wiring (2) was set to be minus.

The voltage V was set to a plus voltage when an electric potential of the wiring (3) (which is on the right side when facing a direction of the plus electric current flowing through the chiral molecule dispersion solution) was higher than an electric potential of the wiring (4) (which is on the left side when facing the direction of the plus electric current flowing through the chiral molecule dispersion solution).

FIG. 18(b) shows a graph showing a change in measured voltage value V. The voltage value V has changed depending upon the voltage applied between the wirings (2) and (6). The voltage value V became minus when the voltage was applied so that the plus electric current flowed through the chiral molecule dispersion solution, and became plus when the voltage was applied so that the minus electric current flowed through the chiral molecule dispersion solution. The voltage V and an electric current I flowing through the chiral molecule dispersion solution had a proportionality relation in which a proportionality constant was minus.

A tendency in the change of the voltage value V was similar to those seen in the first and the second chirality detection experiments and the chirality discrimination experiments.

REFERENCE SIGNS LIST

2: chiral material layer
3a, 3b: electrodes for voltage application
4 spin detection layer
5, 5a, 5b, 5c: power supply
6a, 6b, 6c: voltage measuring section
7: control section
8a, 8b, 8c: electrodes for voltage detection
9: subject
11: chiral material-containing solution, liquid, or gas
12: voltage application section
13, 13a, 13b: magnetic field application section
15: flow channel material
16, 16a, 16b: flow channel
17: right-handed chiral material
18: left-handed chiral material
19, 19a, 19b: coil
20: chirality detector
25: separator
26: input section
27: output section
30: chiral material device

What is claimed is:

1. A chirality detector for detecting chirality of chiral material, comprising: a first electrode and a second electrode that are configured to apply a voltage to a subject containing the chiral material; a spin detection layer configured to be in contact with the subject; a power supply; and a control section, wherein
the power supply and the control section are configured to generate an electric field in the subject by applying the voltage between the first electrode and the second electrode; and
the control section is configured to detect a voltage generated in the spin detection layer in a direction that goes across a direction of the electric field or a voltage generated between the spin detection layer and the subject, and also is configured to detect chirality of the chiral material on the basis of the detected voltage.

2. The chirality detector according to claim 1, wherein
the spin detection layer contains a ferromagnetic body; and
the control section is configured to detect the voltage generated between the spin detection layer and the subject.

3. A chirality detector for detecting chirality of chiral material, comprising: a third electrode and a fourth electrode that are electrically connected with a subject containing the chiral material; a spin injection layer configured to be in contact with the subject; a power supply; and a control section, wherein
the power supply and the control section are configured to apply an electric current to the spin injection layer; and
the control section is configured to detect, with use of the third electrode and the fourth electrode, a voltage generated in the chiral material in a direction that goes across a direction of the electric current, and also is configured to detect chirality of the chiral material on the basis of the detected voltage.

4. A chirality detection method comprising:
upon generating an electric field in a subject containing chiral material, detecting a voltage generated in a spin detection layer in a direction that goes across a direction of the electric field or a voltage generated between the spin detection layer and the subject, the spin detection layer being disposed so as to be in contact with the subject; and
detecting chirality of the chiral material on the basis of the detected voltage.

* * * * *